US009531432B2

United States Patent
Matic et al.

(10) Patent No.: US 9,531,432 B2
(45) Date of Patent: Dec. 27, 2016

(54) ENERGY-EFFICIENT SYSTEM FOR DISTANT MEASUREMENT OF ANALOG SIGNALS

(71) Applicant: ELEKTROTEHNICKI FAKULTET SVEUCILISTA U OSIJEKU, Osijek (HR)

(72) Inventors: Tomislav Matic, Osijek (HR); Marijan Herceg, Osijek (HR); Josip Job, Osijek (HR)

(73) Assignee: ELEKTROTEHNICKI FAKULTET SVEUCILISTA U OSIJEKU, Osijek (HR)

( * ) Notice: Subject to any disclaimer, the term of this patent is extended or adjusted under 35 U.S.C. 154(b) by 0 days.

(21) Appl. No.: 14/895,016

(22) PCT Filed: Jun. 4, 2014

(86) PCT No.: PCT/HR2014/000019
§ 371 (c)(1),
(2) Date: Dec. 1, 2015

(87) PCT Pub. No.: WO2014/195744
PCT Pub. Date: Dec. 11, 2014

(65) Prior Publication Data
US 2016/0142097 A1     May 19, 2016

(30) Foreign Application Priority Data

Jun. 6, 2013 (WO) ................ PCT/HR2013/000015

(51) Int. Cl.
*H03K 7/04* (2006.01)
*H03K 7/06* (2006.01)
(Continued)

(52) U.S. Cl.
CPC .......... *H04B 1/7174* (2013.01); *H03M 1/125* (2013.01); *H04B 1/7163* (2013.01); *H04B 1/71632* (2013.01); *H04B 17/364* (2015.01)

(58) Field of Classification Search
CPC ........ H04L 25/4902; H03K 7/04; H03K 9/04; H04B 14/026; H04B 14/02
(Continued)

(56) References Cited

U.S. PATENT DOCUMENTS 5,159,281 A * 10/1992 Hedstrom ................ H03K 9/06
329/312
5,239,273 A * 8/1993 Hedstrom ................ H03D 3/04
329/312
(Continued)

FOREIGN PATENT DOCUMENTS

WO   WO 2004/039021 A1   5/2004
WO   WO 2008/061245 A2   5/2008

OTHER PUBLICATIONS

"Neural Engineering, Second Edition," Springer 2013.
(Continued)

*Primary Examiner* — James M Perez
(74) *Attorney, Agent, or Firm* — RatnerPrestia

(57) ABSTRACT

An energy-efficient system for measurement of analog signals including one or more measuring units. Each measuring unit has a measuring probe which signal is processed by a modulator. All measuring units have identical modulators selected from the Time Encoding Machine family: Asynchronous Sigma Delta Modulator, Integrate And Fire Modulator and Integral Pulse Frequency Modulator. A signal from the modulator is processed by a delay circuit from which is optionally fed back to the modulator. Signals from the delay circuit and modulator are used to trigger a UWB pulse generator, which is optionally amplified and transmitted via transmission line or antenna. The delay circuit uniquely characterizes the measuring unit and enables the receiving unit to separate received signals from plurality of measuring (Continued)

units signals sent in an unsynchronized manner. The invention is useful for long term acquisition of analog signals, especially time varying signals such as biological signals.

14 Claims, 15 Drawing Sheets

(51) Int. Cl.
*H03K 9/04* (2006.01)
*H03K 9/06* (2006.01)
*H04B 1/717* (2011.01)
*H03M 1/12* (2006.01)
*H04B 1/7163* (2011.01)
*H04B 17/364* (2015.01)

(58) Field of Classification Search
USPC ......... 375/219–223, 239, 259–285, 295–376
See application file for complete search history.

(56) References Cited

U.S. PATENT DOCUMENTS

| | | | | |
|---|---|---|---|---|
| 5,272,448 A * | 12/1993 | Hedstrom | ................ | H03D 3/04 329/312 |
| 6,061,551 A * | 5/2000 | Sorrells | ................... | H03C 1/62 455/118 |
| 7,253,761 B1 * | 8/2007 | Hoyos | .................. | H03M 1/121 341/143 |
| 7,573,956 B2 * | 8/2009 | Lazar | ................... | H03M 1/125 341/110 |
| 7,724,845 B2 * | 5/2010 | Sorrells | ................... | H03D 7/00 375/324 |
| 8,081,946 B2 * | 12/2011 | Fudge | .................. | H04B 1/1036 455/295 |
| 8,149,961 B1 * | 4/2012 | Tewfik | ............... | H04L 27/2665 370/320 |
| 8,334,722 B2 * | 12/2012 | Sorrells | ................. | H03F 1/0272 330/127 |
| 8,552,775 B2 * | 10/2013 | Lee | ...................... | H03L 7/0992 327/159 |
| 8,736,475 B1 * | 5/2014 | Harrison | ............... | H03M 3/504 341/143 |
| 9,154,172 B1 * | 10/2015 | Cruz-Albrecht | ......... | H03K 3/86 |
| 9,276,602 B1 * | 3/2016 | Pagnanelli | ............ | H03M 3/358 |
| 9,295,444 B2 * | 3/2016 | Schwartz | ................. | A61B 8/00 |
| 9,331,878 B2 * | 5/2016 | Cheng | .................. | H04L 27/12 |
| 2003/0091122 A1 * | 5/2003 | Humphreys | ........ | H03K 5/1508 375/295 |
| 2004/0141559 A1 * | 7/2004 | Tewfik | ............... | H04B 1/71635 375/248 |
| 2004/0240588 A1 * | 12/2004 | Miller | ..................... | H04K 1/00 375/340 |
| 2005/0041752 A1 * | 2/2005 | Rosen | ................... | H04L 27/001 375/268 |
| 2006/0119493 A1 * | 6/2006 | Tal | ...................... | H03M 7/3017 341/143 |
| 2006/0203922 A1 * | 9/2006 | Rezeq | ................ | H03M 7/3022 375/247 |
| 2006/0291589 A1 * | 12/2006 | Eliezer | .................... | H03C 3/40 375/302 |
| 2007/0081578 A1 * | 4/2007 | Fudge | ................. | H04B 1/0003 375/130 |
| 2008/0002788 A1 * | 1/2008 | Akhtar | .................. | H03B 19/14 375/298 |
| 2008/0055009 A1 * | 3/2008 | Lerner | ................... | H03B 21/00 331/37 |
| 2008/0055014 A1 * | 3/2008 | Tsfaty | .................... | H03B 19/00 332/127 |
| 2008/0068236 A1 * | 3/2008 | Sheba | ................... | G04F 10/005 341/118 |
| 2008/0169953 A1 * | 7/2008 | Yamamoto | ............ | H03M 3/406 341/155 |
| 2008/0192877 A1 * | 8/2008 | Eliezer | .................. | H03L 7/1806 375/376 |
| 2008/0197943 A1 * | 8/2008 | Xu | ........................... | H03H 9/46 333/194 |
| 2009/0036064 A1 * | 2/2009 | Ravi | ........................ | H03C 3/40 455/76 |
| 2009/0046774 A1 * | 2/2009 | Abou Rjeily | ........ | H04B 1/7176 375/239 |
| 2009/0262877 A1 * | 10/2009 | Shi | ......................... | H03L 1/022 375/376 |
| 2009/0322438 A1 * | 12/2009 | Kronfeld | ................. | H03L 7/193 332/117 |
| 2010/0135368 A1 * | 6/2010 | Mehta | ..................... | H04L 27/38 375/219 |
| 2010/0188148 A1 * | 7/2010 | Mehta | ................... | H03F 1/3247 330/149 |
| 2012/0056676 A1 * | 3/2012 | Frambach | ............... | H03F 3/193 330/295 |
| 2013/0162857 A1 * | 6/2013 | Kwon | .................. | H03M 3/324 348/222.1 |
| 2013/0287065 A1 * | 10/2013 | Sun | ....................... | H03C 3/0941 375/146 |
| 2015/0188737 A1 * | 7/2015 | Xu | .......................... | H04L 25/08 375/296 |
| 2016/0056764 A1 * | 2/2016 | Tham | ..................... | H03D 3/008 327/355 |

OTHER PUBLICATIONS

Horowitz et al., "The Art of Electronics—$2^{nd}$ Edition," Cambridge University Press 1989.

Su, "Asynchronous Signal Processing for Compressive Data Transmission," Thesis presented to the University of Pittsburgh 2011.

Quek et al., "Analysis of UWB Transmitted-Reference Communication Systems in Dense Multipath Channels," IEEE Journal on Selected Areas in Communications, vol. 23, No. 9, Sep. 2005, pp. 1863-1874.

Boer, "Chapter 4: The spectrum of a series of point events, generated by the Integral Pulse Frequency Modulation (IPFM) model," Source: Dissertation "Beat-to-beat blood-pressure fluctuations and heart-rate variability in man: physiological relationships, analysis techniques and a simple model," pp. 65-78. Downloaded from http://dare.uva.nl/document/205496.

Alvarado et al., "The Integrate-and-Fire Sampler: A Special Type of Asynchronous Σ- Δ Modulator," 2011 IEEE International Symposium on Circuits and Systems, May 15-18, 2011, Rio de Janeiro, pp. 2031-2034.

Ouzounov et al, "Analysis and Design of High-Performance Asynchronous Sigma-Delta Modulators with a Binary Quantizer," IEEE Journal of Solid-State Circuits, vol. 41, No. 3, Mar. 2006, pp. 588-596.

Elias et al., "An Analog Memory Circuit for Spiking Silicon Neurons," Neural Computation, Feb. 15, 1997, vol. 9, No. 2, pp. 419-440.

Lee et al., "Front-End Electronics for High Rate Neutron Counters: Its Performance and Radiation Hardness Improvement," Nuclear Science Symposium Conference, Oct. 16-22, 2004, Rome, vol. 3, pp. 1423-1427.

Liao et al., "A Broadband Noise-Canceling CMOS LNA for 3.1-10.6-GHz UWB Receivers," IEEE Journal of Solid-State Circuits, vol. 42, No. 2, Feb. 2007, pp. 329-339.

Liu et al., "A 100Mbps, 0.19mW Asynchronous Threshold Detector with DC Power-Free Pulse Discrimination for Impulse UWB Receiver," IEEE Design Automation Conference, Jan. 19-22, 2009, Yokohama, pp. 97-98.

Rulikowzki et al., "Low Power Consuming Pulse Detector," IEEE International Conference on Ultra-Wideband, Sep. 5-8, 2005, pp. 76-79.

Forouzanfar et al., "High Gain CMOS UWB LNA Employing Thermal Noise Cancellation," IEEE International Conference on Ultra-Wideband, Sep. 9-11, 2009, Vancouver, BC, pp. 118-122.

International Search Report and Written Opinion issued in PCT/HR2014/000019 mailed Nov. 13, 2014.

(56) References Cited

OTHER PUBLICATIONS

International Preliminary Report on Patentability issued in PCT/HR2014/000019 mailed May 12, 2015.

* cited by examiner

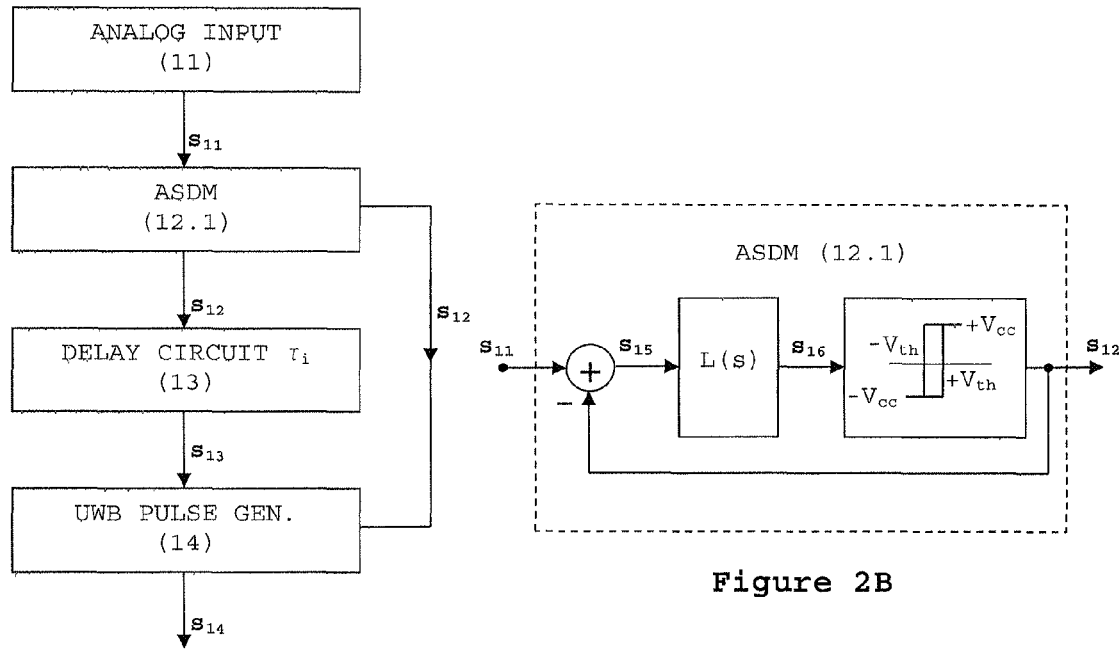
Figure 2A
Figure 2B
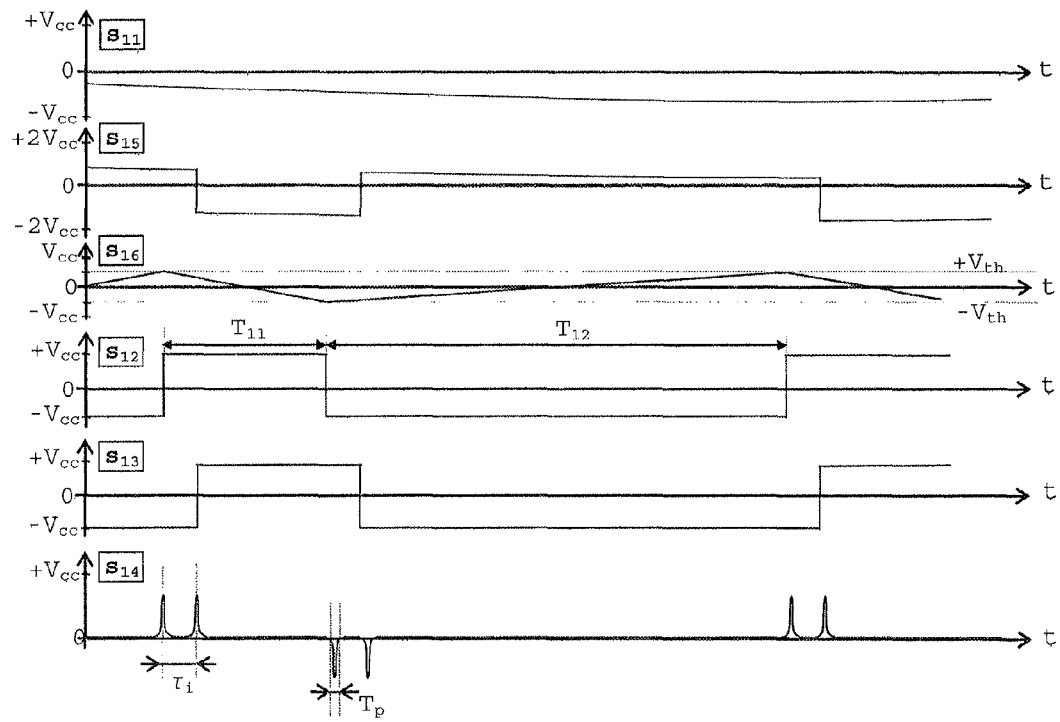
Figure 2C

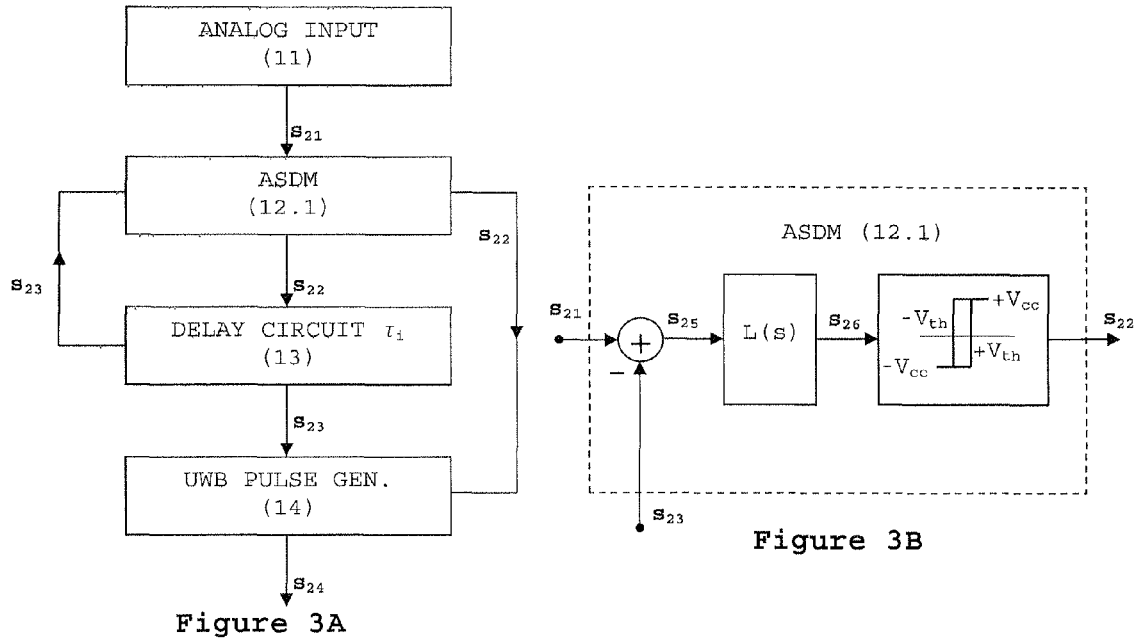
Figure 3A
Figure 3B
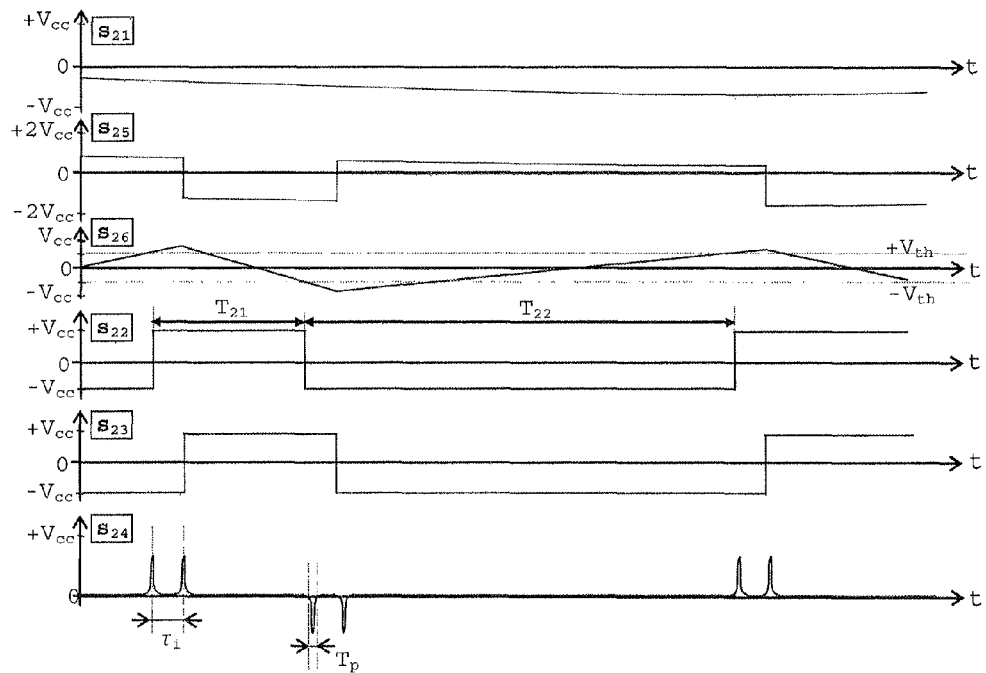
Figure 3C

US 9,531,432 B2

ENERGY-EFFICIENT SYSTEM FOR DISTANT MEASUREMENT OF ANALOG SIGNALS

CROSS REFERENCE TO RELATED APPLICATIONS

This application is the U.S. National Phase Application of PCT/HR2014/000019, filed Jun. 4, 2014, which claims priority to PCT Application No. PCT/HR2013/000015, filed Jun. 6, 2013, the contents of such applications being incorporated by reference herein.

TECHNICAL FIELD

The subject invention belongs to the technical field of analog signals acquisition and conversion into pulses that can be sent across the transmission line to the receiver. More particularly, the subject invention belongs to the energy efficient system useful for long term acquisition of analog signals, especially time varying signals.

Technical Problem

The first technical problem solved with the invention is construction of energy-efficient system for distant and reliable measurement of plurality of analog signals that are transmitted in asynchronous manner to a receiving unit. Energy-efficient system, as used herein, has the meaning that measuring units are capable to measure and transmit measuring values over long time, where time is measured in months or years of operation, without changing built-in power supply or micro energy harvesting device. Distant measuring means that the measuring information can be transmitted wirelessly or via transmission line to the receiving unit. Energy-efficiency is achieved during the process of forming transmitted signals, i.e. no digital signal processor or computational means are used in the process of forming ultra-wide bandwidth (UWB) signal carrying measuring information. In addition, no internal clock or counting module is necessary for the system to operate in a reliable manner that significantly preserves the energy consumption.

The second technical problem solved with the invention is that the number of measuring units that can operate together with one receiving unit can be theoretically very high due to the lack of correlation between the transmissions of the measuring units among themselves or with the receiving unit.

The third technical problem solved with the invention is that measuring units are capable for the long term operation when measuring time varying signals, i.e. biological signals such as ECG (Electrocardiogram) or EEG (Electroencephalogram) electric signals.

PREVIOUS STATE OF ART

Considering the importance of the data acquisition field the previous state of art is extremely rich regarding proposed solutions of before mentioned technical problems.

The document Shuang Su, "Asynchronous Signal Processing for Compressive Data Transmission", Master's Thesis, University of Pittsburgh, 2011, which is incorporated by reference, teaches about a power-efficient procedure useful in the acquisition of biological data in digital form, without using high frequency samplers. The data is compressed so that transmission is limited to parts of the signal that are significant. The procedure uses an Asynchronous Sigma Delta Modulator (ASDM) together with a time-to-digital converter (TDC) to obtain binary data that is transmitted via orthogonal frequency division multiplexing (OFDM). The document uses ASDM connected to the popular scheme for wideband digital communication—OFDM. However OFDM scheme requires significant computational power that leads inevitably to significant power consumption, higher than in the present invention. The document remains silent regarding the possible multiuser system achieved in the present invention by delay circuits built in measuring units. Considering the fact that the performance of the disclosed system was illustrated using an EEG signal, this document forms the closest document in the art.

The document Quek, T. Q. S.; Win, M. Z., "Analysis of UWB transmitted-reference communication systems in dense multipath channels", Selected Areas in Communications, IEEE Journal on, vol. 23, no. 9, pp. 1863, 1874, September 2005 doi: 10.1109/JSAC.2005.853809, which is incorporated by reference, teaches about transmitted-reference (TR) signaling, that in conjunction with an autocorrelation receiver (AcR) offers a low-complexity alternative to Rake reception in UWB systems. The present invention takes advantage of the transmitted reference signaling formed via delay circuits built into each of the measuring units.

The document WO 2008/061245 A2 "Multiple access techniques for a wireless communication medium", Ekbal A. et al., which is incorporated by reference, teaches about TR in UWB transmission for channel numbering, see paragraph no. 0050. However, by careful reading of paragraph 0008 and 0009 of the same document it reveals that TR pulse has no correlation with the data pulse. In the present invention the TR is the data signal shifted in time. That is the core of the present invention.

The document U.S. Pat. No. 7,573,956 B2 "Time Encoding and Decoding of a Signal", Lazar A. A. and Toth L. T., which is incorporated by reference, teaches about various Time encoding/decoding machine (TEM/TDM). In U.S. Pat. No. 7,573,956 B2 a TEM is selected to be an Integrate And Fire Modulator (IAFM), used hereby as an alternative to the previously mentioned Asynchronous Sigma Delta Modulator (ASDM). The document remains silent regarding the possible multiuser system achieved in the present invention by delay circuit built in measuring units.

The document de Boer R. W.: "Beat-to-beat blood-pressure fluctuations and heart-rate variability in man: physiological relationships, analysis techniques and a simple model", PhD Thesis, Faculty of Medicine, University of Amsterdam, 1985, which is incorporated by reference, teaches in Chapter 4, pages 65-78 about the spectrum of a series of point events, generated by the Integral Pulse Frequency Modulation (IPFM) which is the same circuit as the Integrate And Fire Modulator (IAFM) defined in the above cited document U.S. Pat. No. 7,573,956.

The Integral Pulse Frequency Modulator (IPFM) used hereby as an alternative to the previously mentioned Asynchronous Sigma Delta Modulator (ASDM) and Integrate And Fire Modulator (IAFM) can be found in the book Horowitz P.: "Art of Electronics", Cambridge University Press, 1995, second edition, section 9.20, page 625, which is incorporated by reference, and it teaches about single-slope analog-to-digital converter that is previously mentioned Integral Pulse Frequency Modulator (IPFM).

SUMMARY OF INVENTION

The invention discloses an energy-efficient system for distant measurement of analog signals comprising two or more measuring units and a corresponding receiving unit. Each measuring unit comprises an analog input, a modulator that converts the analog input signal into series of pulses, a delay circuit and an UWB pulse generator connected to the transmission line or antenna directly or via an auxiliary amplifier and a power supply.

Receiving unit comprises a receiving line, low noise amplifier, at least one unipolar pulse detector that can be either positive pulse detector or negative pulse detector. One monostable multivibrator follows each pulse detector. Receiving unit comprises additionally a signal processing means and a power supply.

All measuring units have identical modulators selected from the Time Encoding Machine family consisting of: Asynchronous Sigma Delta Modulator (ASDM), Integrate And Fire Modulator (IAFM) and Integral Pulse Frequency Modulator (IPFM). All measuring units use delay circuits tuned to mutually different delay times $\tau_i$ that are used to identify the signal originating from the i-th measuring unit by the signal processing means in a receiving unit. Each UWB pulse generator of the i-th measuring unit is triggered by the series of pulses generated by the modulator and by the series of the same pulses delayed in time by said delay time $\tau_i$ by the corresponding delay circuit. The signal from the delay circuit is optionally fed back to the modulator.

The receiving unit has signal processing means with the demodulator compatible with the pre-selected type of modulators. Said signal processing means is equipped with at least one set of identical delay circuits with delay times $\tau_i$ that corresponds to the set of delay times used by the measuring units. The signal processing means extract received signal corresponding to the i-th measuring unit according to the delay time $\tau_i$ in the form of a pulses suitable for being further processed to analog or digital information.

If the selected modulator of all measuring units is Asynchronous Sigma Delta Modulator (ASDM) then the receiving unit comprises: positive pulse detector and negative pulse detector connected to the output of the low noise amplifier, followed by corresponding monostable multivibrators and two sets of delay circuits tuned to different delay times $\tau_i$ corresponding to the delay times used by the measuring units. One set of delay circuits is connected to the branch dedicated to detection of positive pulses and another set is connected to the branch dedicated to detection of negative pulses. An input into i-th ASDM demodulator consists of original signals from both branches that are previously multiplied by their corresponding signals delayed by the delay time $\tau_i$.

If the selected modulator of all measuring units is an Integrate And Fire Modulator (IAFM) or Integral Pulse Frequency Modulator (IPFM) then the receiving unit comprises unipolar pulse detector connected to the output of the low noise amplifier, followed by monostable multivibrator and only one set of delay circuits tuned to different delay times $\tau_i$ corresponding to the delay times used by the measuring units. An input into i-th IAFM demodulator or IPFM demodulator consist of original signal previously multiplied by their corresponding signal delayed by the delay time $\tau_i$.

Signals generated by the UWB pulse generator in the measuring unit are transmitted via antenna for wireless transmission or via transmission line, where transmission of each measuring unit is performed in unsynchronized manner with other measuring units within the same system. The receiving unit receives signals by: antenna, transmission line or hybrid type consisting of antenna and transmission line.

The power supply of each measuring unit can be a battery integrated into or a micro energy harvesting device.

Proposed system is useful for long term acquisition of analog signals such as biological signals, more particularly time varying biological signals such as ECG or EEG.

BRIEF DESCRIPTION OF DRAWINGS

The present invention is represented via series of FIGS.;
FIG. 2A shows a measuring unit with the implemented ASDM as a time encoding machine;
FIG. 2B shows a variant of used ASDM modulator and FIG. 2C shows corresponding signal processing by the circuits presented on FIGS. 2A and 2B. The feedback is performed within the used ASDM.
FIG. 3A shows a measuring unit with the implemented ASDM as a time encoding machine;
FIG. 3B shows a variant of used ASDM modulator and FIG. 3C shows corresponding signal processing by the circuits presented on FIGS. 3A and 3B. The feedback signal for the used ASDM is extracted from the delay circuit.
FIG. 6B shows a variant of used IPFM modulator and FIGS. 6A and 6D show corresponding signal processing by the circuits presented on FIGS. 6A and 6B when [c=1; $S_{ref}=0$] and [c=1/2; $S_{ref}=V_{cc}/2$] correspondingly. The feedback is performed within the used IPFM.

DETAILED DESCRIPTION

The present invention discloses energy-efficient system for distant measurement of analog signals.

The term "system" refers to the one or more measuring units (10) and a corresponding receiving unit (20).

The term "energy-efficient" refers to measuring units (10) that are capable to measure and transmit measuring values over long time, where time is measured in months or years of operation, without changing built-in power supply; or indefinitely by using built-in micro energy harvesting device. This makes measuring units (10) suitable for various measuring processes with almost no maintenance required over the proposed lifetime. However, due to the required low noise amplifier (22) and the fact that the present invention still need continuous listening via receiving unit (20) of the transmissions performed by the measuring units (10), the term "energy-efficient" is not applicable to the receiving unit (20).

Measuring Unit in General

The term "analog input" (11) refers to any circuit that is capable to provide analog voltage or current signal that varies in time and is associated with some measured physical observable such as: pressure, temperature, resistivity, magnetic/electric field, humidity, flux, speed, etc.

Figure 1:
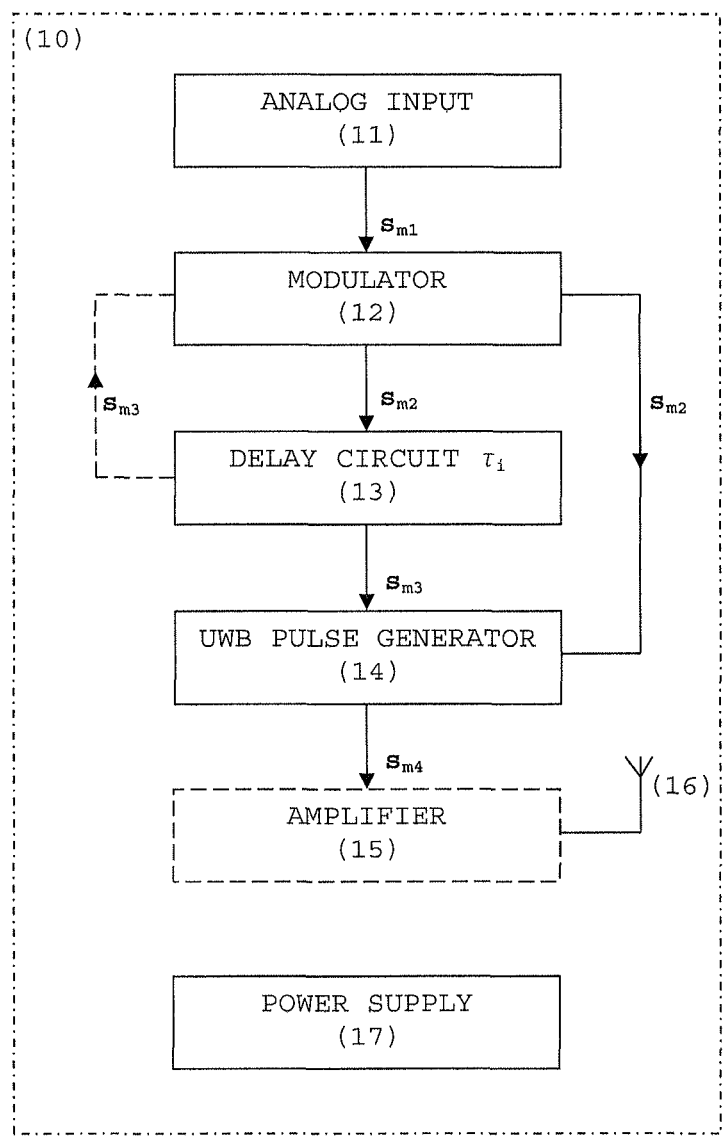
FIG. 1 shows a general scheme of a measuring unit.

The general scheme of a measuring unit (10) is disclosed on FIG. 1; it consists of analog input (11), modulator (12), delay circuit (13), UWB pulse generator (14), optional amplifier (15), transmission line or antenna (16) and a build-in power supply (17). The circuitry for analog input (11) can be found widely in the literature and strongly depends on physical observable and application. The selection of the analog input (11) circuit should be done to minimise the consumption power needed for the analog input (11) operation. The signal that comes from the analog input (11) is denoted as $s_{m1}$ where m∈[1,6] assigns various embodiments of the invention.

Signal $s_{m1}$ enters the modulator (12). All measuring units (10) of the same measuring system have identical modulators (12) selected from the Time Encoding Machine (TEM) family consisting of: Asynchronous Sigma Delta Modulator (12.1), Integrate And Fire Modulator (12.2) and Integral Pulse Frequency Modulator (12.3). From the article Alvarado A. S.; "The integrate-and-fire sampler: A special type of asynchronous sigma delta modulator"; IEEE International Symposium on Circuits and Systems (ISCAS), p. 2031-2034; 2011, which is incorporated by reference, it is evident that ASDM and IAFM belongs to the same circuit family. The similar connection can be established between IAFM and IPFM; i.e. via the reference book: "Neural Engineering", edited by Bin He; 2005, Kluwer Academics/Plenum Publishers; on page 344 in chapter 10.3.—Models for Neuronal Rate Coding, which is incorporated by reference.

Generally, any TEM family member is characterized by the L(s) that is a transfer function of the loop filter. In theory it that can be either ideal integrator $L(s)=1/(s \cdot T_{int})$, first order low-pass filter (LP1) where $L(s)=1/(1+s \cdot T_{LP1})$, or optionally higher order low-pass filter. In family members used by the invention, the transfer function of the loop filter is selected to be an ideal integrator $L(s)=1/(s \cdot T_{int})$ where said selection provides linear time encoding. For the large constant $T_{LP1}$, low-pass filter can be used as ideal integrator as well.

The $s_{m2}$ signal is the signal obtained from processed analog signal $s_{m1}$ by the suitable modulator (12) where analog inputs are encoded into series of pulses. A $s_{m2}$ signal is further processed by a delay circuit (13) resulting with the signal $s_{m3}$. The $s_{m3}$ signal is identical to $s_{m2}$ signal but delayed in time for the time interval $\tau_i$. Index i∈[1, N] denotes N different measuring units (10) within the same measuring system; each measuring unit (10) is characterised by a delay circuit (13) tuned to different values $\tau_i$ that enables the receiving unit (20) to separate received signals from various measuring units (10).

In some embodiments, as will be explained later in more details, signal $s_{m3}$ is fed back to the modulator (12), and in other embodiments signal $s_{m2}$ resulting from the modulator (12) output is fed back within the modulator (12). Regardless the nature where the feedback line is extracted, this signal is necessary for normal operation of the selected Time Encoding Machine.

Two signals, $s_{m2}$ from the modulator (12) and $s_{m3}$ from the delay circuit (13) are used to trigger UWB pulse generator (14), producing the signal $s_{m4}$. Triggering is performed by the rising signal edge 0→$V_{CC}$ of the signals $s_{m2}$ and $s_{m3}$ in case of IAFM and IPFM modulators. In case of ASDM modulator triggering is performed by the signals $s_{m2}$ and $s_{m2}$ on their rising and falling edges.

Signal $s_{m4}$ can be optionally amplified via amplifier (15); however such application is not desirable in most cases due to the higher power consumption. Finally, amplified or not, UWB signal $s_{m4}$ is transmitted via antenna or transmission line (16). Transmission can be performed through any suitable medium for UWB signal propagation; through air i.e. wirelessly or by adequate wave guide. Considering the nature of the projected system the preferable mode of transmission is wireless transmission. It is worth to mention that there is no correlation between the measuring units (10) regarding the transmission. For the detailed theory of the UWB pulse generation and practical electronic realization please see the following set of references:

Rulikowski, P.; Sokol, V.; Barrett, J., "Low power consuming pulse detector," Ultra-Wideband, 2005. ICU 2005. 2005 IEEE International Conference on, vol., no., pp. 4 pp., 5-8 Sep. 2005;

Lechang Liu; Miyamoto, Y.; Zhiwei Zhou; Sakaida, K.; Ryu, J.; Ishida, K.; Takamiya, M.; Sakurai, T., "A 100 Mbps, 0.19 mW asynchronous threshold detector with DC power-free pulse discrimination for impulse UWB receiver," Design Automation Conference, 2009. ASP-DAC 2009. Asia and South Pacific, vol., no., pp. 97, 98, 19-22 Jan. 2009.

The standard power supply (17) for the measuring unit can be any type of the batteries, rechargeable or not. However due to the low consumption even micro energy harvesting devices (MEHD) can be used alone or in conjunction with rechargeable batteries as a power supply (17). By mentioning MEHD we refer to both cases i.e. with or without rechargeable batteries integrated into a MEHD. MEHD can use vibrations/movements of the measuring devices (10), inductive coupling, temperature gradients, light sources, external fields or any other ways known in the art to convert the energy from measuring unit's environment into electric energy needed for operation.

Measuring Unit where ASDM is Selected as TEM

FIGS. 2A and 2B show the embodiment where Time Encoding Machine is selected to be an Asynchronous Sigma Delta Modulator (ASDM), i.e. embodiment m=1. Analog input (11) signal $s_{11}$ is processed by the ASDM (12.1) to produce $s_{12}$ signal that is fed back within the said ASDM (12.1), and further processed by the delay circuit (13) to obtain $s_{15}$ signal. Signals $s_{11}$ and $s_{12}$ are subtracted within the ASDM (12.1) to produce signal $s_{15}$ that is integrated to give the signal $s_{16}$ which is processed by the Schmitt trigger to form the signal $s_{12}$; FIG. 2B. Finally signals $s_{12}$ and $s_{15}$ are used for triggering UWB pulse generator (14) by its edges to produce $s_{14}$, signal. FIG. 2C shows all relevant signals $s_{11}$-$s_{16}$ vs. time.

For this embodiment where Asynchronous Sigma Delta Modulator—ASDM has been used, the loop filter transfer function is $L(s)=1/(s \cdot T_{int})$. Maximum ASDM oscillation frequency is $f_{C1}=1/T_{C1}=V_{cc}/(4V_{th} T_{int})$ where $V_{th}$ is Schmitt trigger positive hysteresis level threshold voltage, $V_{cc}$ is standard acronym for supply voltage. Maximum ASDM oscillation frequency $f_{C1}$ is occurred when minimal impulse $T_{11}$ and pause duration $T_{12}$ is achieved; i.e. $(T_{11})_{min}=(T_{12})_{min}$. This is obtained for $s_{11}=0$, while $(T_{11})_{min}+(T_{12})_{min}=T_{C1}$.

Duty cycle $\alpha$ of the ASDM output signal $\alpha=T_{11}/(T_{11}+T_{12})=(1+s_{11}/V_{cc})/2$, and instantaneous ASDM output signal frequency $f_{ASDM1}=f_{C1}=f_{C1}(1-(s_{11}/V_{cc})^2)$, where $s_{11}$ is instantaneous input signal voltage $-V_{cc} \leq s_{11} \leq +V_{CC}$. For $s_{11}(t)=A_1 \cdot \sin(2\pi f_{11} \cdot t)$, condition for ideal time encoding is $f_{11} >> f_{ASDM1}$; $f_{11}$ stands for the input signal frequency, and $A_1$ for the corresponding signal amplitude.

FIGS. 3A and 3B show the embodiment where Time Encoding Machine is again selected to be Asynchronous Sigma Delta Modulator, i.e. embodiment m=2. Analog input (11) signal $s_{21}$ is processed by the ASDM (12.1) to produce $s_{22}$ signal further processed by the delay circuit (13) to obtain $s_{23}$ signal. Signals $s_{11}$ and $s_{23}$ are subtracted within the ASDM (12.1) to produce signal $s_{25}$ that is integrated to give the signal $s_{26}$ which is processed by the Schmitt trigger to form the signal $s_{22}$; FIG. 3B. Finally, signals $s_{22}$ and $s_{23}$ are used for triggering UWB pulse generator (14) by its edges to produce $s_{24}$ signal. FIG. 3C shows all the relevant signals $s_{21}$-$s_{26}$ vs. time.

For said alternate embodiment where again ASDM is used, the transfer function is $L(s)=1/(s \cdot T_{int})$. Maximum ASDM oscillation frequency is equal to $f_{C2}=1/T_{C2}=V_{CC}/(4V_{th}T_{int}+4\tau_i V_{CC})$, where $V_{th}$ is again Schmitt trigger positive hysteresis level threshold voltage, $V_{cc}$ is standard acronym for voltage supply and $\tau_i$ is the characteristic time of the delay circuit (13). Maximum ASDM oscillation frequency $f_{C2}$ occurred when minimal impulse $T_{21}$ and pause duration $T_{22}$ is achieved; i.e. $(T_{21})_{min}=(T_{22})_{min}$. This is obtained for $s_{21}=0$, while $(T_{21})_{min}+(T_{22})_{min}=T_{C2}$.

Duty cycle $\alpha$ of the ASDM output signal $\alpha=T_{21}/(T_{21}+T_{22})=(1+s_{21}/V_{cc})/2$, and instantaneous ASDM output signal frequency $f_{ASDM2}=f_{C2}(1-(s_{21}/V_{cc})^2)$, where $s_{21}$ is instantaneous input signal voltage $-V_{CC} \leq s_{21} \leq +V_{CC}$. For $s_{21}(t)=A_2 \cdot \sin(2\pi f_{21} \cdot t)$, condition for ideal time encoding is $f_{21} << f_{ASDM2}$; $f_{21}$ stands again for the input signal frequency, and $A_2$ for the corresponding signal amplitude.

For the detailed theory of the ASDM operation and practical electronic realization please see the following reference:

Ouzounov, S.; Engel Roza; Hegt, J. A.; Van Der Weide, G.; Van Roermund, A. H M, "Analysis and design of high-performance asynchronous sigma-delta Modulators with a binary quantizer," Solid-State Circuits, IEEE Journal of, vol. 41, no. 3, pp. 588, 596, March 2006.

When two or more measuring units (10) working at the same time it is necessary to distribute corresponding delay times $\tau_i$ of each i-th delay circuit (13). It can be done in various ways, however linear distribution seems to be plausible so the delay times are adjusted in the manner that $\tau_i=\tau_p \cdot (jN+ji-j)$; where $i \in [1, N]$ is a positive integer and with the provision that $\tau_i < T_C/2$. The value $T_c$ is minimum period of the pulsed signal out of the Asynchronous Sigma Delta Modulator (12.1), j being a positive integer, N is the total number of users i.e. different measuring units (10), and $T_p$ being UWB pulse time duration. The role of the integer j is to ensure that two measuring units (10) have their delay times spaced for at least $j \cdot T_p$ time frames to prevent false reading by the receiving unit (20). Above cited condition prevents "coping over" and ensures adequate distribution of pulses. For larger j, the minimal timing difference between two measuring unit (10) delays $\tau_i$ will be higher and therefore the probability of "coping over" will be minimized.

Measuring Unit where IAFM is Selected as TEM

Figure 4A:
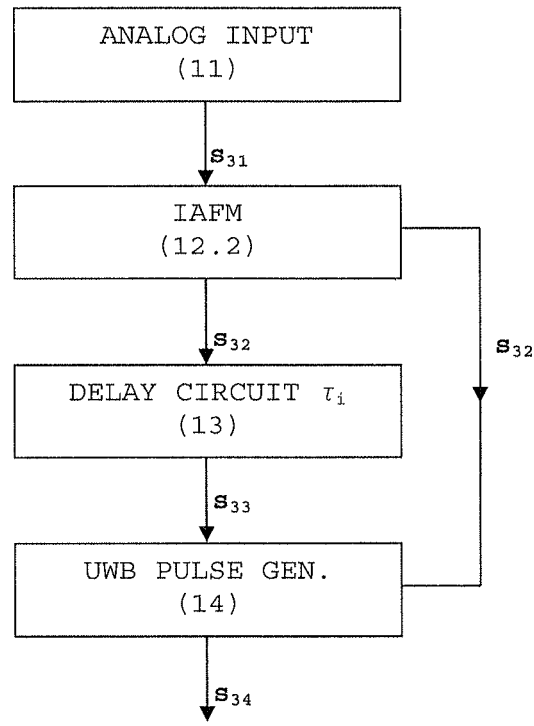
FIG. 4A shows a measuring unit with the implemented IAFM as a time encoding machine.
Figure 4B:
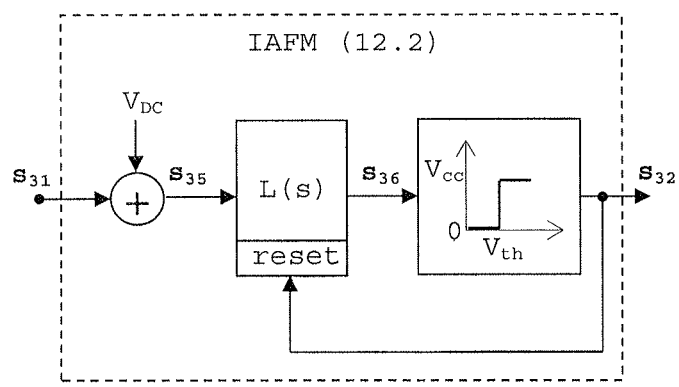
FIG. 4B shows a variant of used IAFM modulator and FIGS. 4C and 4D show corresponding signal processing by the circuits presented on FIGS. 4A and 4B when $V_{DC}=0$ and $V_{DC}=V_{cc}$ correspondingly. The feedback is performed within the used IAFM.
Figure 4C:
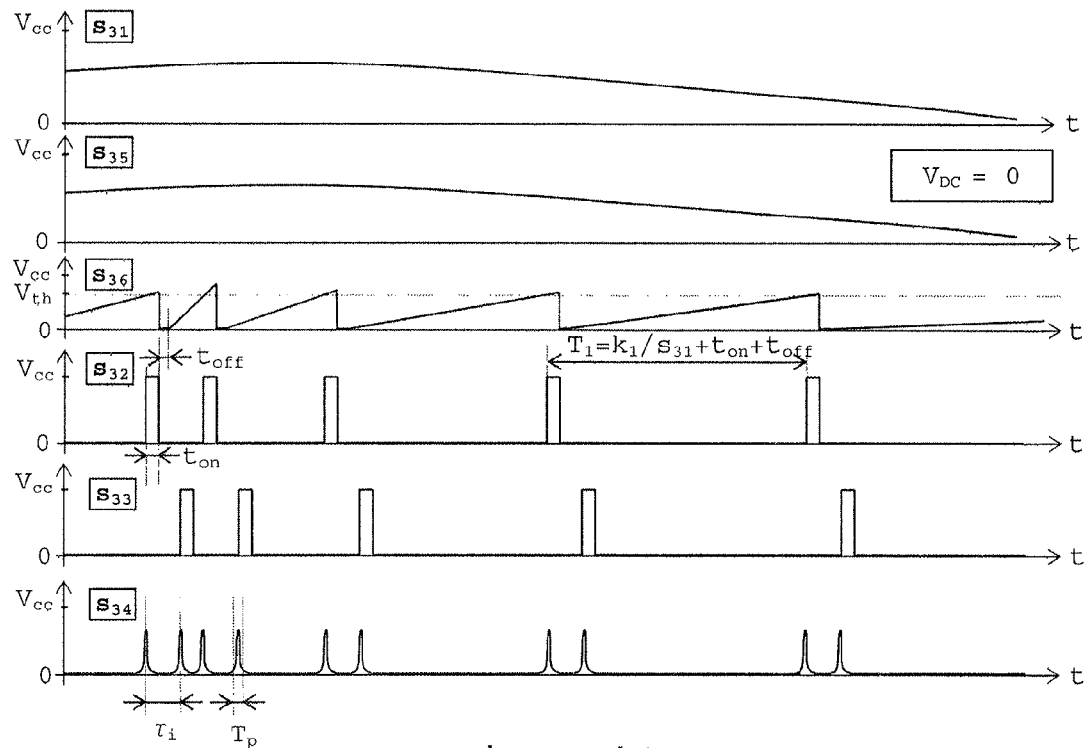
Figure 4D:
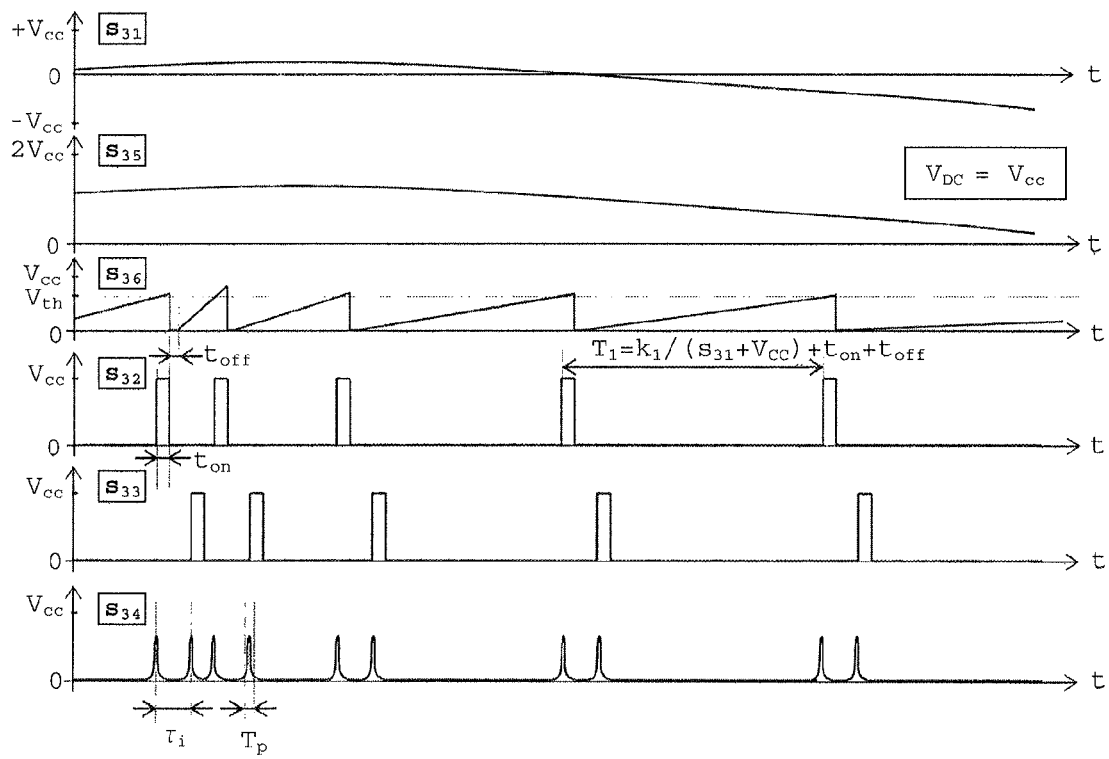

FIGS. 4A and 4B show the embodiment where Time Encoding Machine is selected to be an Integrate And Fire Modulator (IAFM), i.e. embodiment m=3. Analog input (11) signal $s_{31}$ is processed by the IAFM (12.2) to produce $s_{32}$ signal that is fed back within the said IAFM (12.2), and further processed by the delay circuit (13) to obtain $s_{33}$ signal. Signal $s_{32}$ is used as the integrator reset; signal $s_{31}$ and $V_{DC}$-constant voltage—are added within the IAFM (12.2) to produce signal $s_{35}$ that is integrated to give the signal $s_{36}$ which is processed by the comparator to form the signal $s_{32}$; FIG. 4B. Finally signals $s_{32}$ and $s_{33}$ are used for triggering UWB pulse generator (14) by its rising edges to produce $s_{34}$ signal. FIG. 4C shows all relevant signals $s_{31}$-$s_{36}$ vs. time for the $V_{DC}=0$ and FIG. 4D shows all relevant signals $s_{31}$-$s_{36}$ vs. time for the $V_{DC}=V_{CC}$.

For this embodiment where Integrate And Fire Modulator (IAFM) has been used, the transfer function is again $L(s)=1/(s \cdot T_{int})$. The time interval between two consecutive IAFM output pulses is equal to $T_1=k_1/(s_{31}+V_{DC})+t_{on}+t_{off}$, where $-V_{CC} \leq s_{31} \leq +V_{CC}$, $V_{th}$ is a comparator threshold voltage, $k_1=T_{int}V_{th}$, $t_{on}$ is time required for switching on the integrator reset and $t_{off}$ is time required for switching off the integrator reset. For the input signal $s_{31}(t)=A_3 \cdot \sin(2\pi f_{31}t)$, condition for ideal time encoding is $f_{31} << 1/T_{1\ min}$, where $T_{1\ min}$ is the minimum time interval between two consecutive IAFM output pulses. According to the input signal level, constant voltage $V_{DC}$ can be used to ensure that integrator input signal voltage $s_{35}$ is always positive. Therefore for unipolar input signals $V_{DC}=0$, while for bipolar input signals it can be adjusted to $V_{DC}=V_{CC}$.

Figure 5A:
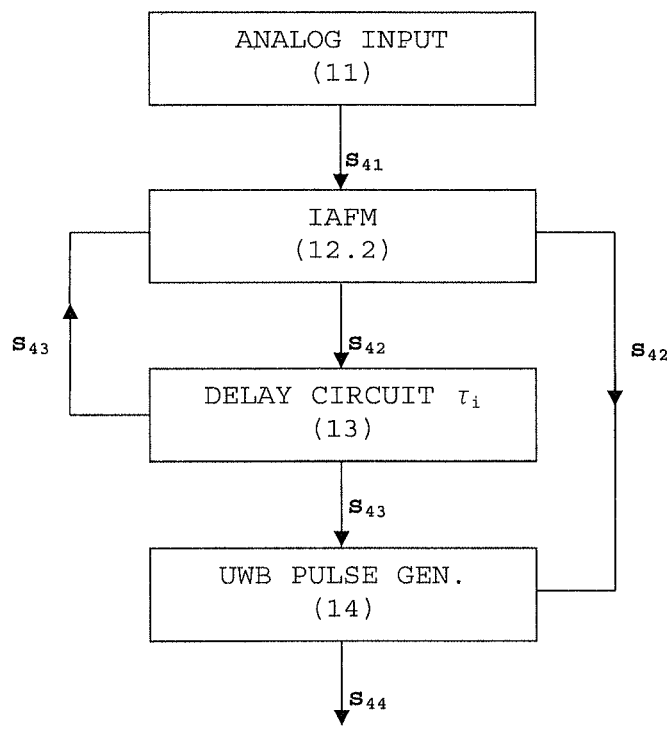
FIG. 5A shows a measuring unit with the implemented IAFM as a time encoding machine.
Figure 5B:
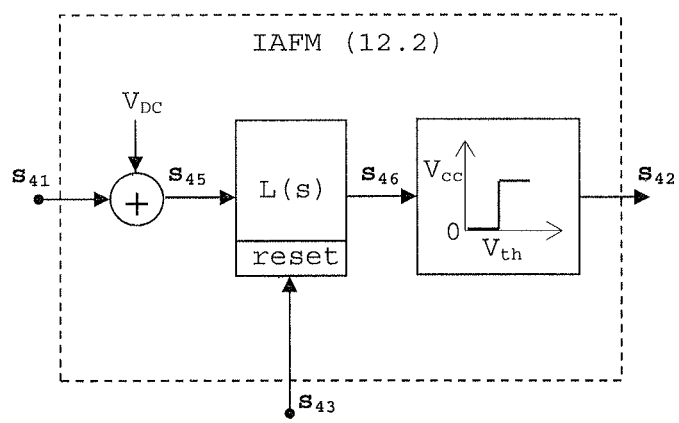
FIG. 5B shows a variant of used IAFM modulator and FIGS. 5C and 5D show corresponding signal processing by the circuits presented on FIGS. 5A and 5B when $V_{DC}=0$ and $V_{DC}=V_{cc}$ correspondingly. The feedback signal for the used IAFM is extracted from the delay circuit.
Figure 5C:
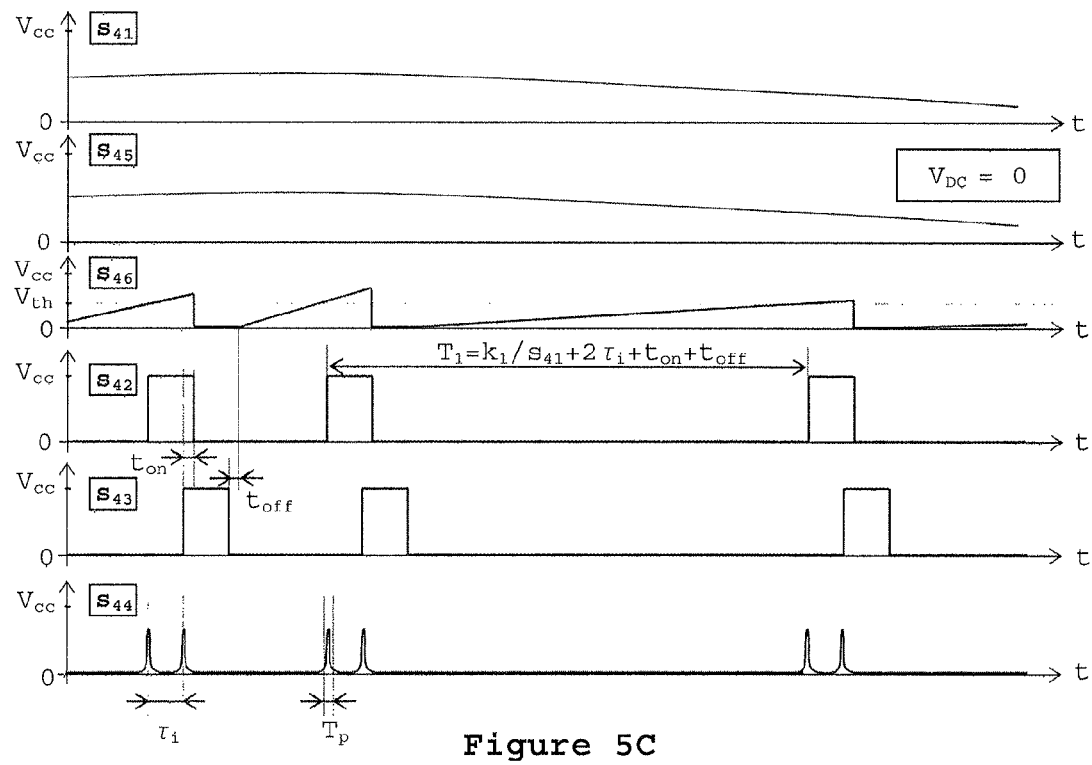
Figure 5D:
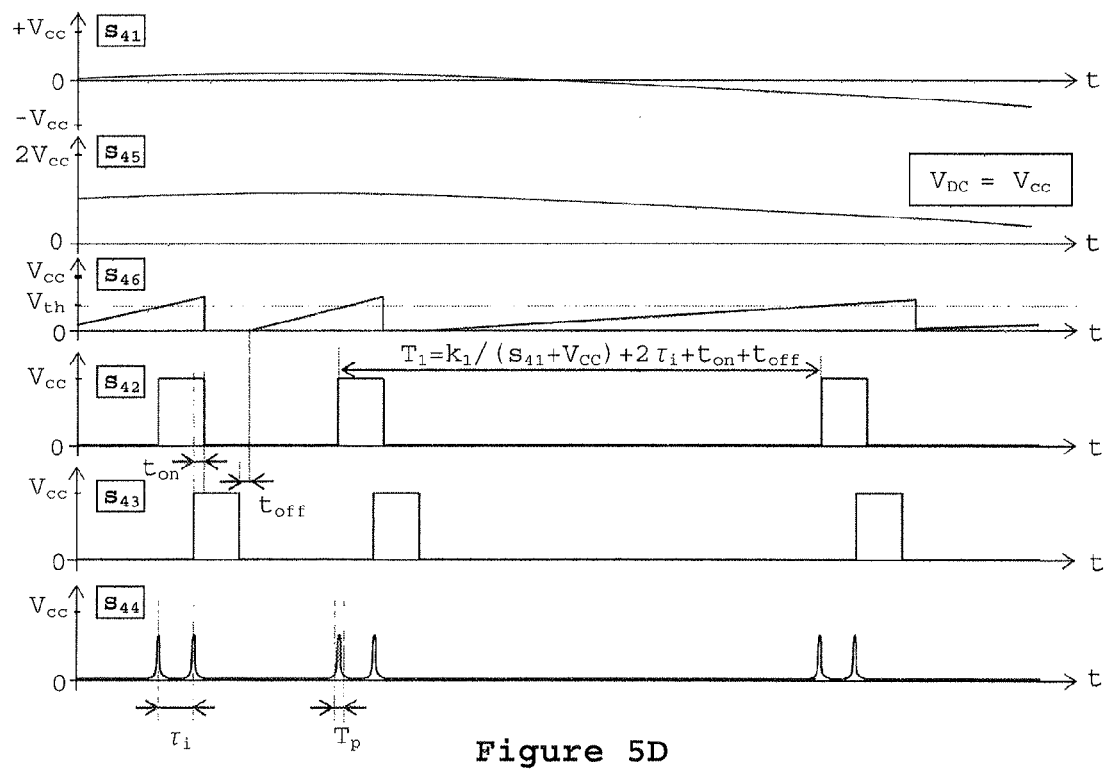

FIGS. 5A and 5B show alternative embodiment where again Time Encoding Machine is selected to be an Integrate And Fire Modulator (IAFM), i.e. embodiment m=4. Analog input (11) signal $s_{41}$ is processed by the IAFM (12.2) to produce $s_{42}$ signal that is further processed by the delay circuit (13) to obtain $s_{43}$ signal. Signal $s_{43}$ is used as the integrator reset; signal $s_{41}$ and $V_{DC}$—bias voltage—are added within the IAFM (12.2) to produce signal $s_{45}$ that is integrated to give the signal $s_{46}$ which is processed by the comparator to form the signal $s_{42}$; FIG. 5B. Finally signals $s_{42}$ and $s_{43}$ are used for triggering UWB pulse generator (14) by its rising edges to produce $s_{44}$ signal. FIG. 5C shows all relevant signals $s_{41}$-$s_{46}$ vs. time for the $V_{DC}=0$ and FIG. 5D shows all relevant signals $s_{41}$-$s_{46}$ vs. time for the $V_{DC}=V_{CC}$.

For this embodiment where Integrate And Fire Modulator (IAFM) has been used, the transfer function is again $L(s)=1/(s \cdot T_{int})$. The time interval between two consecutive IAFM output pulses is equal to, $T_1=k_1/(s_{41}+V_{DC})+2\tau_i+t_{on}+t_{off}$ where $-V_{CC} \leq s_{41} \leq +V_{CC}$, $V_{th}$ is a comparator threshold voltage, $k_1=T_{int}V_{th}$, $t_{on}$ is time required for switching on the integrator reset and $t_{off}$ is time required for switching off the integrator reset. For an sinusoidal input signal $s_{41}(t)=A_4 \cdot \sin(2\pi f_{41}t)$, condition for ideal time encoding is $f_{41} << 1/T_{1\ min}$, where $T_{1\ min}$ is the minimum time interval between two consecutive IAFM output pulses. According to the input signal level, constant voltage $V_{DC}$ can be used to ensure that integrator input signal voltage $s_{45}$ is always positive. Therefore for unipolar input signals $V_{DC}=0$, while for bipolar input signals it can be adjusted to $V_{DC}=V_{CC}$.

For the detailed theory of the IAFM operation and practical electronic realization please see the following references:

de Boer R. W.: "Beat-to-beat blood-pressure fluctuations and heart-rate variability in man: physiological relationships, analysis techniques and a simple model", PhD Thesis, Faculty of Medicine, University of Amsterdam, 1985;

U.S. Pat. No. 7,573,956 B2 "Time Encoding and Decoding of a Signal", Lazar A. A. and Toth L. T.

John G. Elias, David P. M. Northmore, and Wayne Westerman. An analog memory circuit for spiking silicon neurons. Neural Comput. 9, 2 (February 1997), 419-440.

Again, where two or more measuring units (10) with the built-in IAFM as the TEM is working at the same time it is necessary to distribute corresponding delay times $\tau_i$ of each i-th delay circuits (13). It can be done in various ways, however linear distribution seems to be plausible so the delay times are adjusted in the manner that $\tau_i = T_p \cdot (jN+ji-j)$; where $i \in [1, N]$ is a positive integer and with the provision that $\tau_i < T_{1\ min}$. The value $T_{1\ min}$ is the minimum time interval between two consecutive IAFM output pulses, j being a positive integer, N is the total number of users i.e. different measuring units (10), and $T_p$ being UWB pulse time duration. The role of the integer j is to ensure that two measuring units (10) have their delay times spaced for at least $j \cdot T_p$ time frames to prevent false reading by the receiving unit (20). Above cited condition prevents "coping over" and ensures adequate distribution of pulses. For larger j, the minimal timing difference between two measuring unit (10) delays $\tau_i$ will be higher and therefore the probability of "coping over" will be minimized.

Measuring Unit where IPFM is Selected as TEM

Figure 6A:
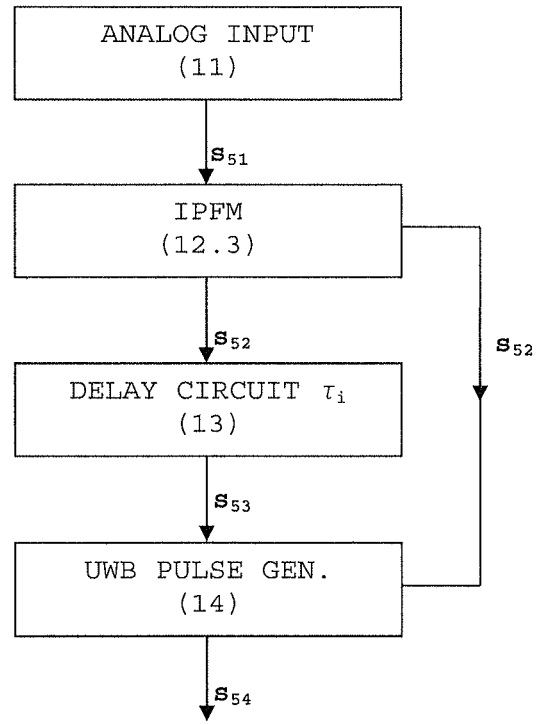
FIG. 6A shows a measuring unit with the implemented IPFM as a time encoding machine.
Figure 6B:
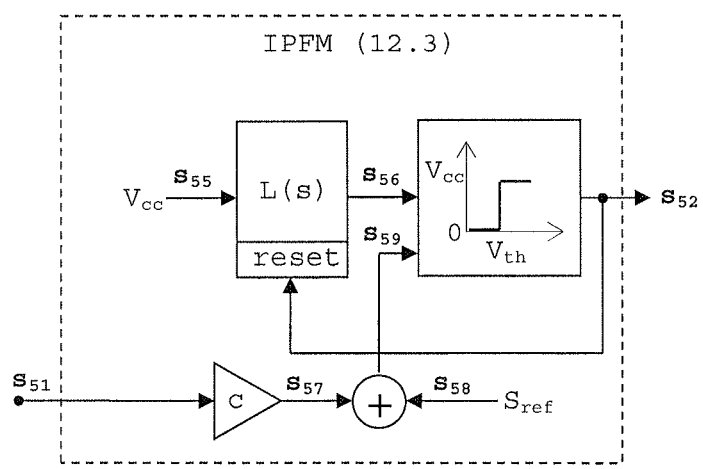
Figure 6C:
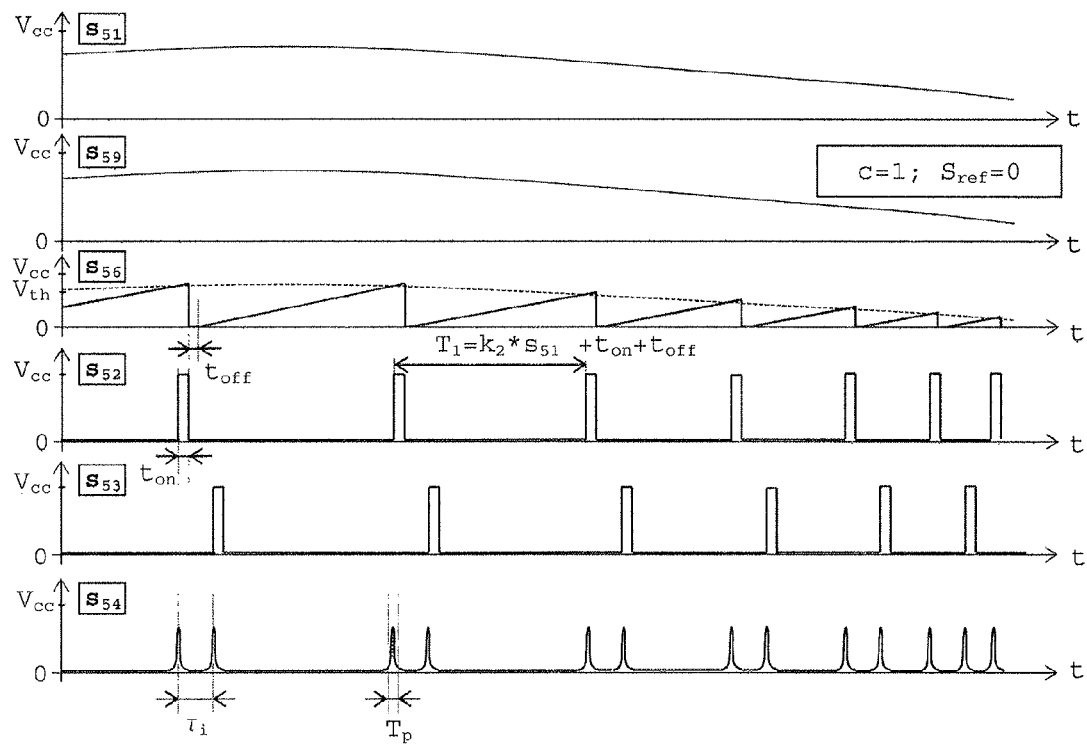
Figure 6D:
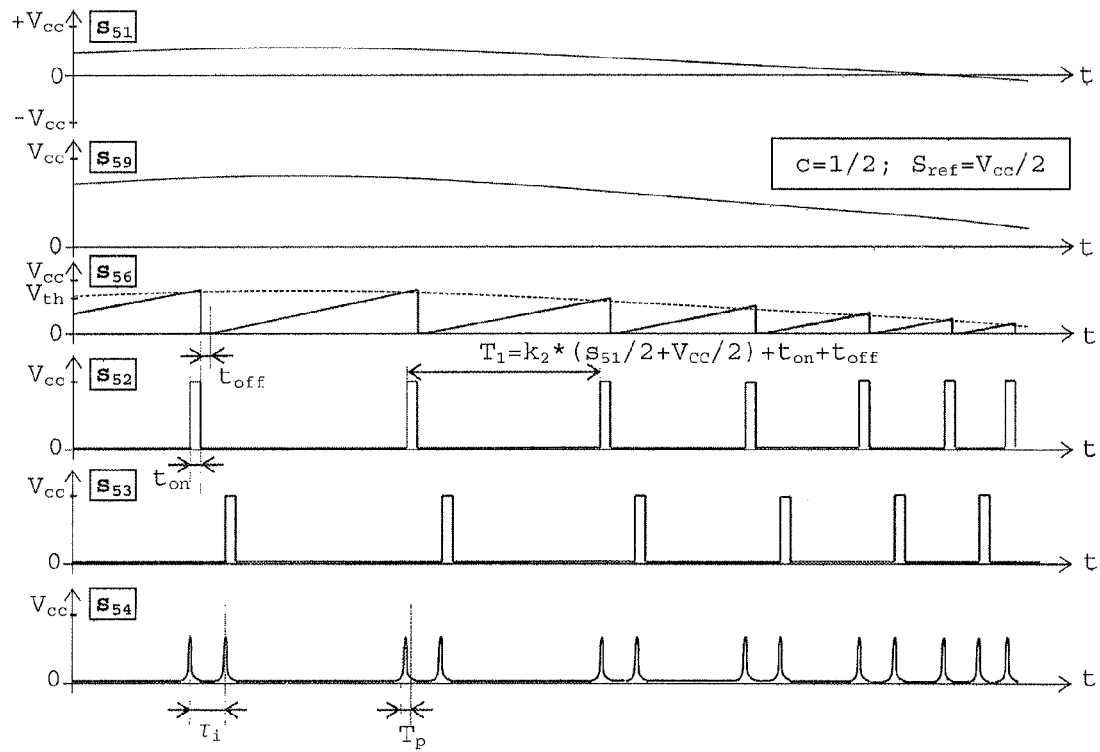

FIGS. 6A and 6B show the embodiment where Time Encoding Machine is selected to be an Integral Pulse Frequency Modulator (IPFM), i.e. embodiment m=5. Analog input (11) signal $s_{51}$ is processed by the IPFM (12.3) to produce $s_{52}$ signal that is fed back within the said IPFM (12.3), and further processed by the delay circuit (13) to obtain $s_{53}$ signal. Signal $s_{52}$ is used as the integrator reset. Signal $s_{51}$ is amplified by constant c to produce signal $s_{57}$ to which is added signal $s_{58}$ i.e. $S_{ref}$—constant voltage to produce signal $s_{59}$ that is comparator threshold voltage. Signal $s_{55}$, set to be $V_{CC}$, is fed to the integrator to produce signal $s_{56}$ as the input signal for the comparator from which the signal $s_{52}$ is obtained; FIG. 6B. Finally signals $s_{52}$ and $s_{53}$ are used for triggering UWB pulse generator (14) by its rising edges to produce $s_{54}$ signal. FIG. 6C shows all relevant signals $s_{51}$-$s_{54}$, $s_{56}$ and $s_{59}$ vs. time for the $S_{ref}=0$ and c=1; while FIG. 6D shows all relevant signals $s_{51}$-$s_{54}$, $s_{56}$ and $s_{59}$ vs. time for the $S_{ref}=V_{CC}/2$ and c=1/2.

For this embodiment where Integral Pulse Frequency Modulator (IPFM) has been used, the transfer function is again $L(s)=1/(s \cdot T_{int})$. The time interval between two consecutive IPFM output pulses is equal to $T_1=k_2(c \cdot s_{51}+S_{ref})+t_{on}+t_{off}$, where $-V_{CC} \leq s_{51} \leq +V_{CC}$, c is constant, $k_2=T_{int}/V_{cc}$, $t_{on}$ is time required for switching on the integrator reset and $t_{off}$ is time required for switching off the integrator reset. For a sinusoidal input signal $s_{51}(t)=A_5 \sin(2\pi f_{51} t)$, condition for ideal time encoding is $f_{51} \ll 1/T_{1\ min}$ where $T_{1\ min}$ is minimum time interval between two consecutive IPFM output pulses. According to the input signal level, constant c and voltage $S_{ref}$ can be used to ensure that comparator threshold voltage $s_{59}$ is always positive due to constantly positive integrator output signal slope. Therefore for unipolar input signals, i.e. where $s_{51} > 0$, the choice can be c=1, and $S_{ref}=0$ while for bipolar input signals, i.e. $-V_{CC} < s_{51} \leq +V_{CC}$, including $s_1=0$, the logical choice is c=1/2 and $S_{Ref}=V_{CC}/2$. Specifically, if expected input signal voltage is equal to $-V_{CC}$, than the value of the constant c is set to be c<1/2 in order to avoid zero comparator threshold voltage value.

Figure 7A:
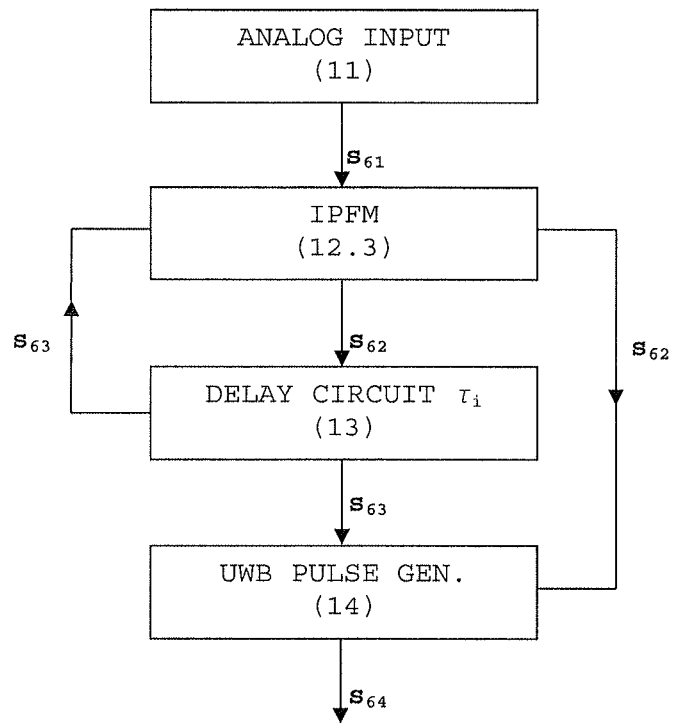
FIG. 7A shows a measuring unit with the implemented IPFM as a time encoding machine.
Figure 7B:
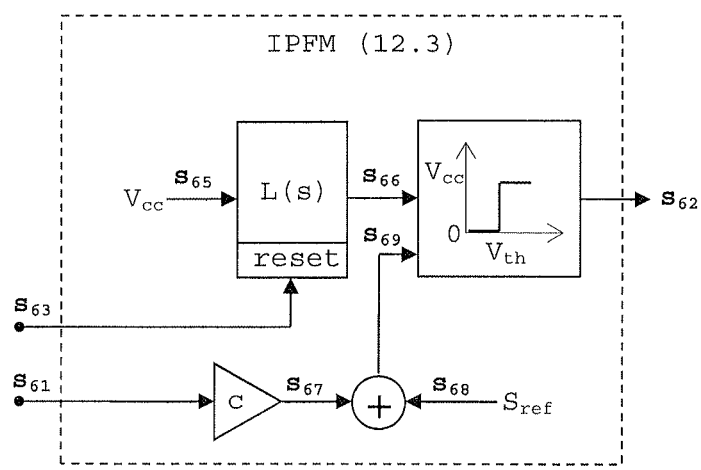
FIG. 7B shows a variant of used IPFM modulator and FIGS. 7C and 7D show corresponding signal processing by the circuits presented on FIGS. 7A and 7B when [c=1; $S_{ref}=0$] and [c=1/2; $S_{ref}=V_{cc}/2$] correspondingly. The feedback signal for the used IPFM is extracted from the delay circuit.
Figure 7C:
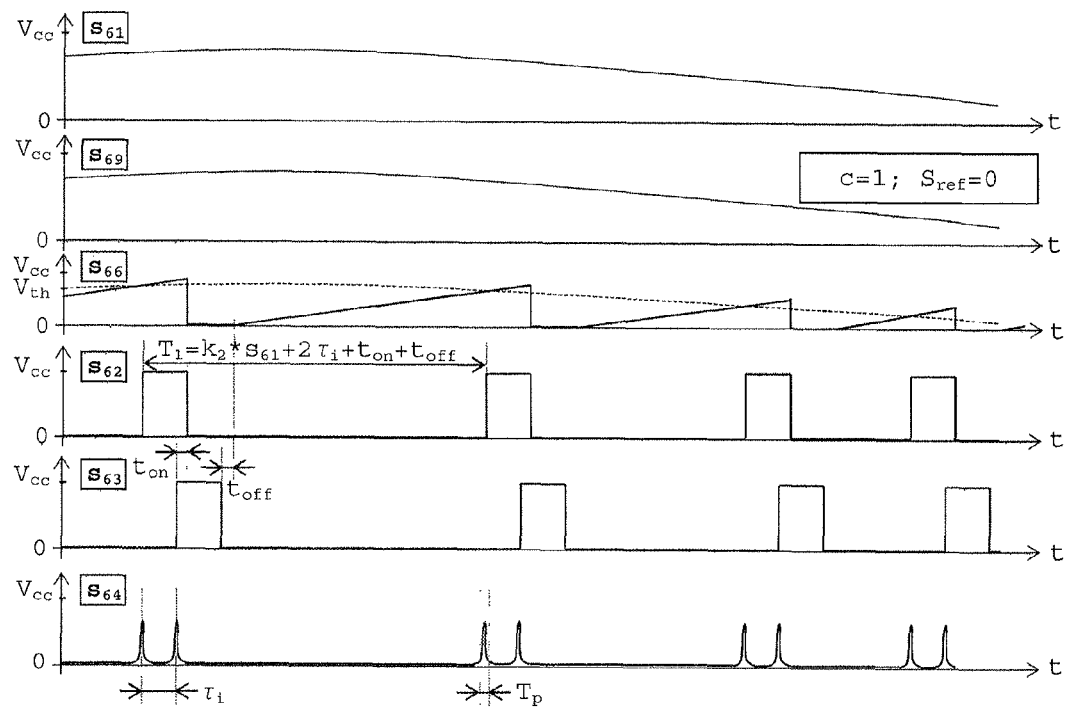
Figure 7D:
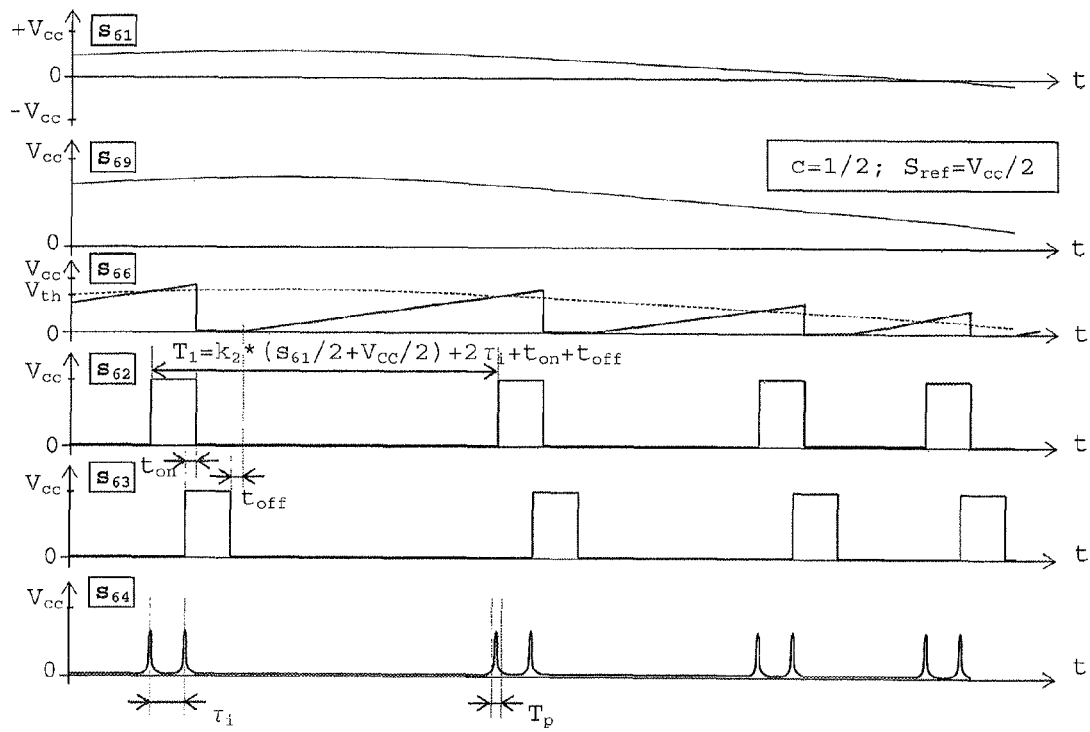

FIGS. 7A and 7B show the embodiment where Time Encoding Machine is selected to be again an Integral Pulse Frequency Modulator (IPFM), i.e. embodiment m=6. Analog input (11) signal $s_{61}$ is processed by the IPFM (12.3) to produce $s_{62}$ signal that is further processed by the delay circuit (13) to obtain $s_{63}$ signal that is fed back to the IPFM (12.3) as the integrator reset, FIG. 7B. Signal $s_{61}$ is amplified by the constant c to produce signal $s_{67}$ to which is added signal $s_{68}$ i.e. $S_{ref}$—constant voltage to produce signal $s_{69}$ that is comparator threshold voltage. Signal $s_{65}$, set to be $V_{CC}$, is fed to the integrator to produce signal $s_{66}$ as the input signal for the comparator from which the signal $s_{62}$ is obtained; FIG. 7B. Finally signals $s_{62}$ and $s_{63}$ are used for triggering UWB pulse generator (14) by its rising edges and to produce $s_{64}$ signal. FIG. 7C shows all relevant signals $s_{61}$-$s_{64}$, $s_{66}$ and $s_{69}$ vs. time for the $S_{ref}=0$ and c=1; while FIG. 7D shows all relevant signals $s_{61}$-$s_{64}$, $s_{66}$ and $s_{69}$ vs time for the $S_{ref}=V_{CC}/2$ and c=1/2.

For this embodiment where Integral Pulse Frequency Modulator (IPFM) has been used, the transfer function is again $L(s)=1/(s \cdot T_{int})$. The time interval between two consecutive IPFM output pulses is equal to $T_1=k_2(c \cdot s_{61} \cdot S_{ref})+2\tau_i+t_{on}+t_{off}$, where $-V_{CC} \leq s_{61} \leq +V_{CC}$, c is constant, $k_2=T_{int}/V_{cc}$, $t_{on}$ is time required for switching on the integrator reset and $t_{off}$ is time required for switching off the integrator reset. For a sinusoidal input signal $s_{61}(t)=A_6 \sin(2\pi f_{61} t)$, condition for ideal time encoding is $f_{61} \ll 1/T_{1\ min}$ where $T_{1\ min}$ is minimum time interval between two consecutive IPFM output pulses. According to the input signal level, constant c and voltage $S_{ref}$ can be used to ensure that comparator threshold voltage $s_{69}$ is always positive due to constantly positive integrator output signal slope. Therefore for unipolar input signals, i.e. where $s_{61} > 0$, the choice can be c=1, and $S_{ref}=0$, while for bipolar input signals, i.e. $-V_{CC} < s_{61} \leq +V_{CC}$, including $s_1=0$, the logical choice is c=1/2 and $S_{Ref}=V_{CC}/2$. Specifically, if expected input signal voltage is equal to $-V_{CC}/2$, than the value of the constant c is set to be c<1/2 in order to avoid zero comparator threshold voltage value.

For the detailed theory of the IPFM operation and practical electronic realization please see the following reference:

Horowitz P.: "Art of Electronics", Cambridge University Press, 1995, second edition, section 9.20, page 625.

Again, where two or more measuring units (10) with the built-in IPFM as the TEM is working in the same time it is necessary to distribute corresponding delay times $\tau_i$ of each i-th delay circuit (13). It can be done in various ways, however linear distribution seems to be plausible so the delay times are adjusted in the manner that $\tau_i=T_p \cdot (jN+ji-j)$; where $i \in [1, N]$ is a positive integer and with the provision that $\tau_i < T_{1\ min}$. The value $T_{1\ min}$ is the minimum time interval between two consecutive IPFM output pulses, j being a positive integer, N is the total number of users i.e. different measuring units (10), and $T_p$ being UWB pulse time duration. The role of the integer j is to ensure that two measuring units (10) have their delay times spaced for at least $j \cdot T_p$ time frames to prevent false reading by the receiving unit (20). Above cited condition prevents "coping over" and ensures adequate distribution of pulses. For larger j, the minimal timing difference between two measuring unit (10) delays $\tau_i$ will be higher and therefore the probability of "coping over" will be minimized.

Finally, having in mind that the duty cycle greatly affects the consumption, the logical choice for the TEM, i.e. the modulator, is one that is possible to be constructed with shorter duty cycle. The main disadvantage of the ASDM over IAFM and IPFM, applied as TEM, is the need for bipolar UWB pulse generators. Therefore, the system is more complex, which increases circuit design demands in the both measuring unit (10) and receiving unit (20). Also, ASDM output pulse duty cycle is larger and for that reason it consumes more power inside measuring unit (10).

Receiving Unit in General

Figure 8:
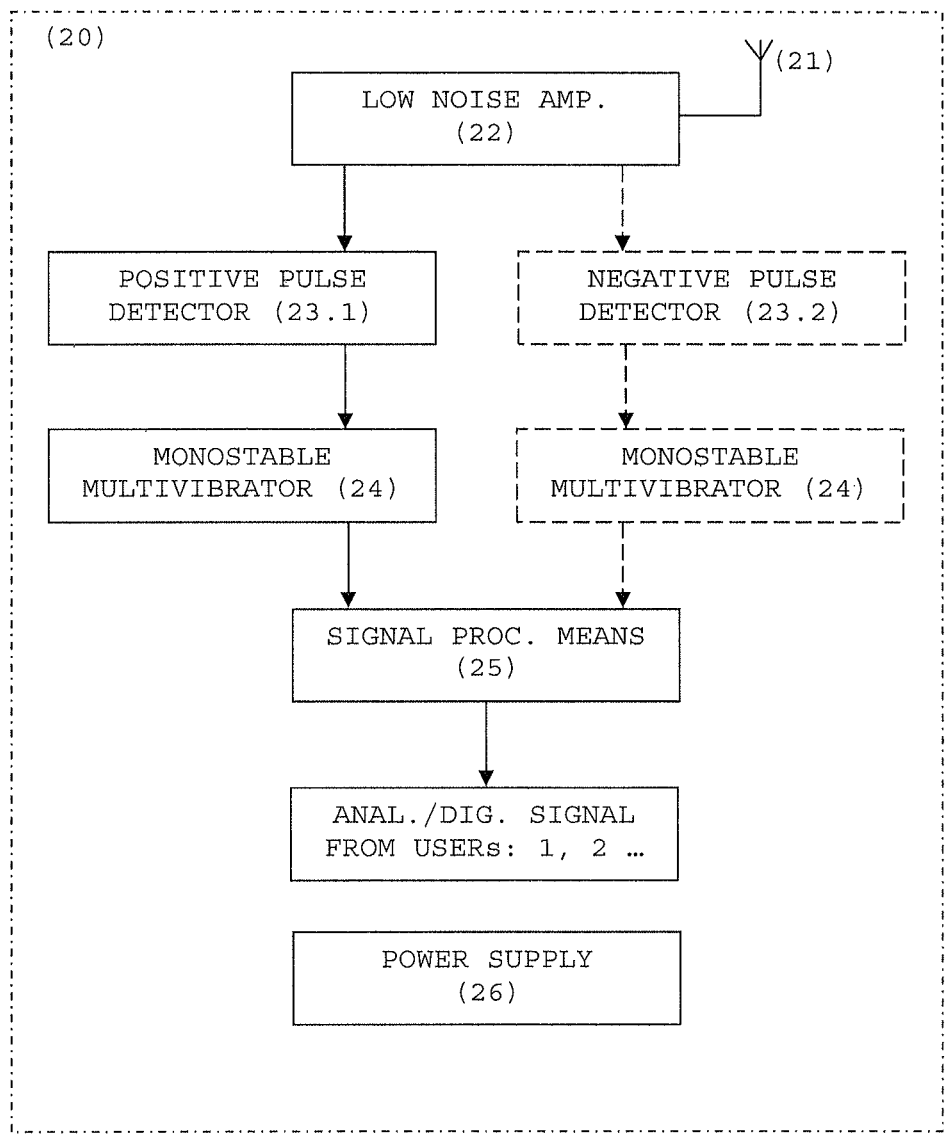
FIG. 8. shows a general scheme of a receiving unit.

The general scheme of a receiving unit (20) is disclosed on FIG. 8; it consists of a low noise amplifier (22) connected to the receiving line or antenna (21) or both, one unipolar pulse detector (23) (UPD), or two pulse detectors (PD) i.e. positive pulse detector (23.1) (PPD) and negative pulse detector (23.2) (NPD). Each pulse detector is followed by a monostable multivibrator (24) (MM), where resulting signal or signals enter signal processing means (25). A power supply (26) of any kind ensures power for the normal operation of the receiving unit (20).

Receiving line or antenna (21) or their combination provides the UWB signal for the low noise amplifier (22). The role of a low noise amplifier is well known in the art, to ensure the signal that can further be processed. The pulse detector of any kind, i.e. unipolar pulse detector (23), positive pulse detector (23.1) or negative pulse detector (23.2) detect the corresponding received pulse positive/negative and trigger monostable multivibrator (24) in order to produce a signal for further processing via signal processing means (25).

The circuitry of the low noise amplifier (22), various pulse detectors (23, 23.1, 23.2), and monostable multivibrator (24) represents a general knowledge; good references are:

Chih-Fan Liao; Shen-Iuan Liu, "A Broadband Noise-Canceling CMOS LNA for 3.1-10.6-GHz UWB Receivers," Solid-State Circuits, IEEE Journal of, vol. 42, no. 2, pp. 329, 339, February 2007;

Forouzanfar, M.; Naseh, S., "High gain CMOS UWB LNA employing thermal noise cancellation," Ultra-Wideband, 2009. ICUWB 2009. IEEE International Conference on, vol., no., pp. 118, 122, 9-11 Sep. 2009;

Rulikowski, P.; Sokol, V.; Barrett, J., "Low power consuming pulse detector," Ultra-Wideband, 2005. ICU 2005. 2005 IEEE International Conference on, vol., no., pp. 4 pp., 5-8 Sep. 2005;

Lechang Liu; Miyamoto, Y.; Zhiwei Zhou; Sakaida, K.; Ryu, J.; Ishida, K.; Takamiya, M.; Sakurai, T., "A 100 Mbps, 0.19 mW asynchronous threshold detector with DC power-free pulse discrimination for impulse UWB receiver," Design Automation Conference, 2009. ASP-DAC 2009. Asia and South Pacific, vol., no., pp. 97, 98, 19-22 Jan. 2009;

Tae Hoon Lee; Ho Dong Kim; Seong Won Park, "Front-end electronics for high rate neutron counters: its performance and radiation hardness improvement," Nuclear Science Symposium Conference Record, 2004 IEEE, vol. 3, no., pp. 1423, 1427 Vol. 3, 16-22 Oct. 2004;

Horowitz P.: "Art of Electronics", Cambridge University Press, 1995, second edition.

Receiving Unit Having ASDM Demodulator

Figure 9A:
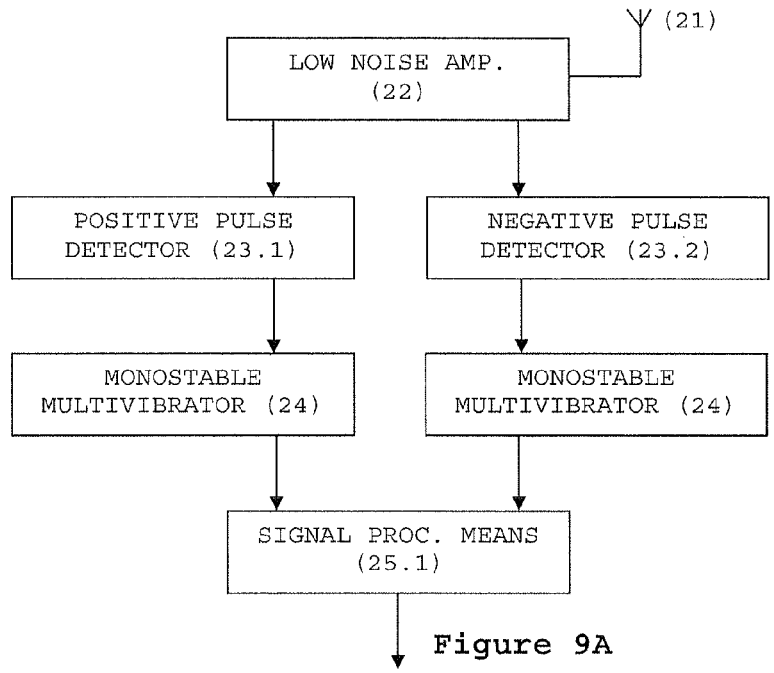
FIGS. 9A and 9B show a receiving unit having implemented signal processing means with plurality of ASDM demodulators.
Figure 9B:
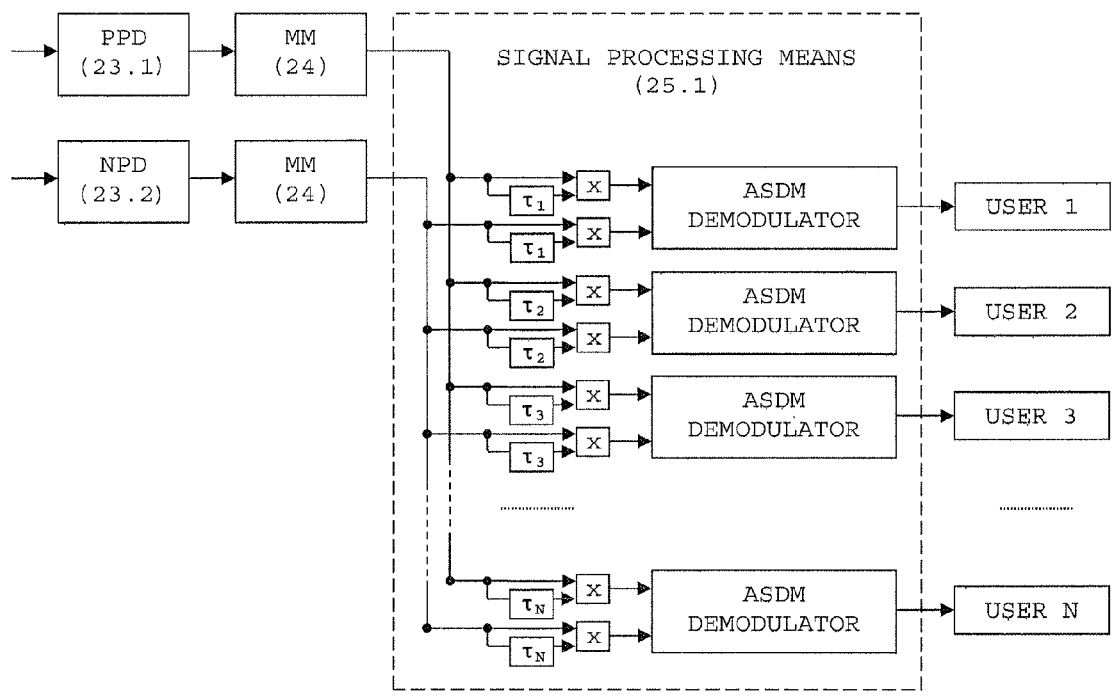

FIGS. 9A and 9B discloses receiving unit (20) having Asynchronous Sigma Delta Demodulators (ASDM Demodulators) incorporated into signal processing means for ASDM modulation (25.1). Signal received by a receiving line or antenna (21) is amplified via low noise amplifier (22). FIGS. 2C and 3C show that the UWB pulse generator (14) generates bipolar signals when the ASDM is used as TEM. To detect such signals it is necessary to use positive pulse detector (23.1) and negative pulse detector (23.2) connected directly to the low noise amplifier (22). Each pulse detector (23.1, 23.2) triggers corresponding monostable multivibrator (24)—MM and produces two series of pulses. Within the signal processing means, each series of pulses is subjected to the series of pulse analysers characterised by their delay circuits tuned to one particular $\tau_i$ used by i-th measuring unit (10). Pulse analyser is formed as the multiplication device of two different signals sampled from the same signal branch; one being an original signal and another delayed in time by same $\tau_i$. Each ASDM demodulator receives signal from both branches—positive and negative and if both signals exist, ASDM demodulator reconstruct the signal from the i-th user via edge combiner known in the art. The other ASDM demodulators are not affected by the received signal due to the fact that multiplication in corresponding pulse analysers produces 0, except in the analyser tuned to some particular measuring unit (10). The final form of signal can be digital information or analog voltage output from the measuring unit (10), here denoted as some particular "user".

Receiving Unit Having IAFM Demodulator

Figure 10A:
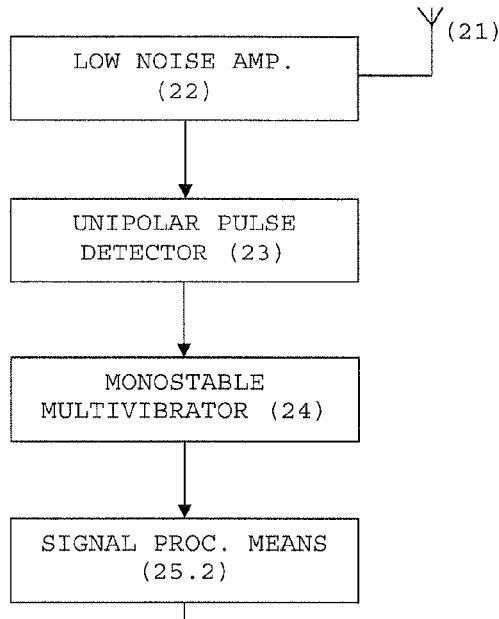
FIGS. 10A and 10B show a receiving unit having implemented signal processing means with plurality of IAFM demodulators.
Figure 10B:
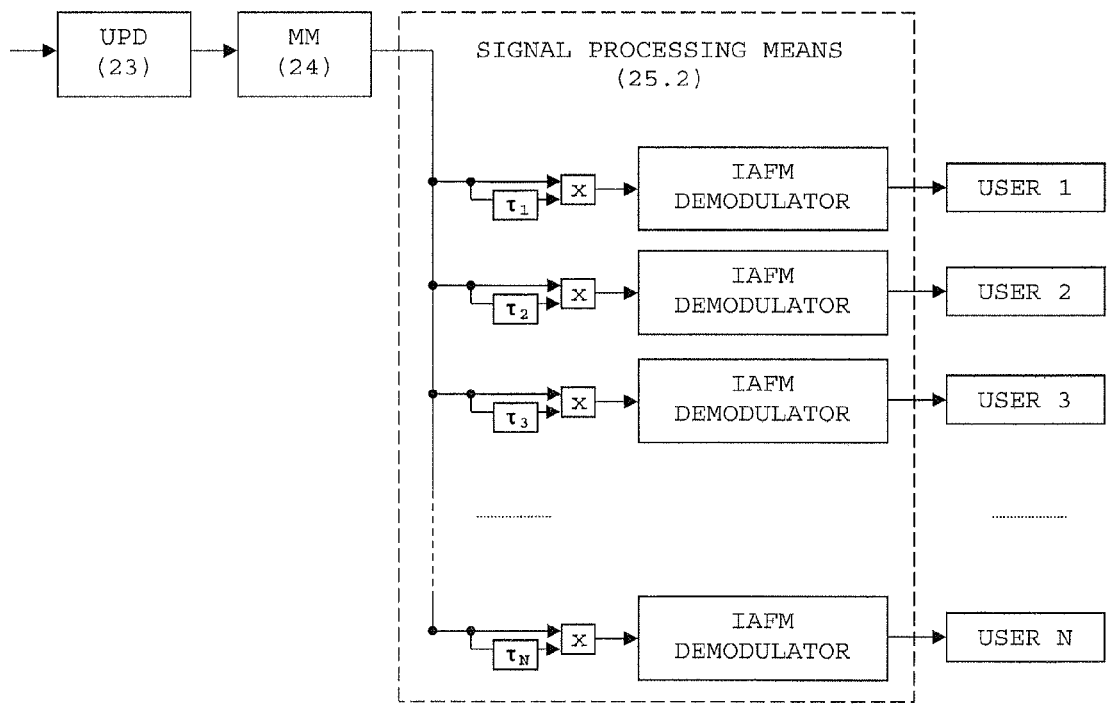

FIGS. 10A and 10B discloses receiving unit (20) having Integrate And Fire Demodulators (IAFM Demodulators) incorporated into signal processing means for IAFM modulation (25.2). Signal received by the receiving line or antenna (21) is amplified via low noise amplifier (22). FIGS. 4C, 4D, 5C and 5D show that the UWB pulse generator (14) generates unipolar signals when the IAFM is used as TEM. To detect such signals it is necessary to use unipolar pulse detector (23)—UPD connected directly to the low noise amplifier (22). Unipolar pulse detector (23) triggers corresponding monostable multivibrator (24) MM and produces series of pulses. Within the signal processing means, series of pulses is subjected to the series of pulse analysers characterised by their delay circuits, each tuned to one particular $\tau_i$ used by i-th measuring unit (10). Pulse analyser is formed again as the multiplication device of two different signals sampled from the signal branch; one being an original signal and another delayed in time by same $\tau_i$. Each IAFM demodulator receives and reconstructs received signals, but only one where pulse analyser produces result different from 0, i.e. the analyser tuned to some particular measuring unit (10), can reconstruct the signal. The other IAFM demodulators are not affected by the received signal due to the fact that multiplication in corresponding pulse analysers produces 0. The final form of signal can be digital information or analog voltage output from the measuring unit (10), here denoted as some particular "user".

Receiving Unit Having IPFM Demodulator

Figure 11A:
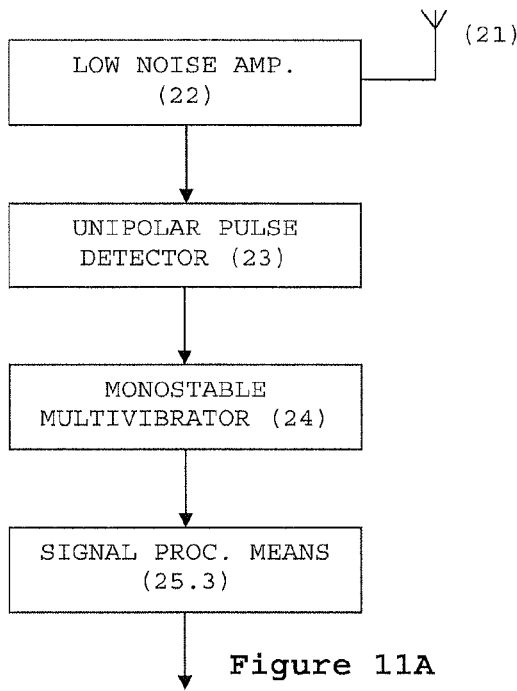
FIGS. 11A and 11B show a receiving unit having implemented signal processing means with plurality of IPFM demodulators.
Figure 11B:
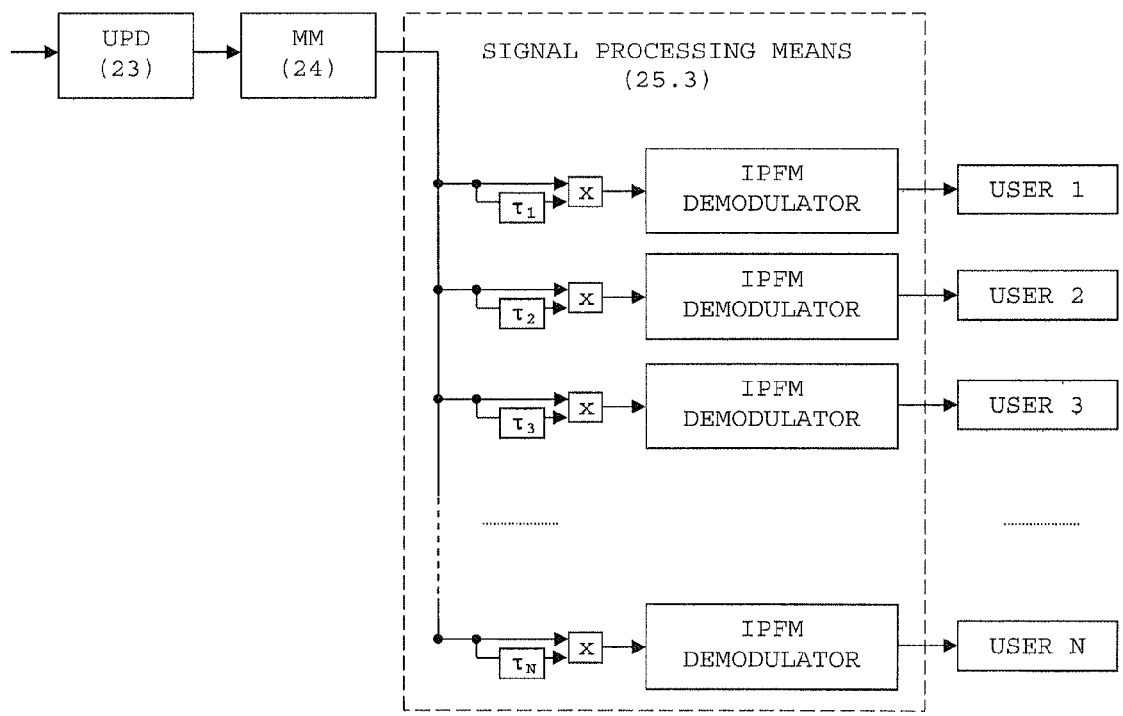

FIGS. 11A and 11B discloses receiving unit (20) having Integral Pulse Frequency Demodulators (IPFM Demodulators) incorporated into signal processing means for IPFM modulation (25.3). Signal received by a receiving line or an antenna (21) is amplified via low noise amplifier (22). FIGS. 6C, 6D, 7C and 7D show that the UWB pulse generator (14) generates unipolar signals when the IPFM is used as TEM. To detect such signals it is necessary to use unipolar pulse detector (23)—UPD connected directly to the low noise amplifier (22). Unipolar pulse detector (23) triggers corresponding monostable multivibrator (24)—MM and produces series of pulses. Within the signal processing means, series of pulses are subjected to the series of pulse analysers characterised by their delay circuits, each tuned to one particular $\tau_i$ used by i-th measuring unit (10). Pulse analyser is formed again as the multiplication device of two different signals sampled from the signal branch; one being an original signal and another delayed in time by some $\tau_i$. Each IPFM demodulator receives and reconstructs received signals, but only one where pulse analyser produces result different from 0, i.e. the analyser tuned to some particular measuring unit (10), can reconstruct the signal. The other IPFM demodulators are not affected by the received signal due to the fact that multiplication in corresponding pulse analysers produces 0. The final form of signal can be digital information or analog voltage output from the measuring unit (10), here denoted as some particular "user".

INDUSTRIAL APPLICABILITY

Industrial applicability of the given invention is obvious and offers an energy-efficient system for distant measurement or transmission of analog signals. The system is extremely useful for long term acquisition of analog signals such as biological signals, more particularly time varying biological signals such as ECG or EEG. The main advantage of the proposed system is the construction of measuring units (10) without digital logic, counters or similar computation devices that significantly reduces power consumption.

REFERENCES

10 measuring unit
11 analog input
12 modulator
12.1 Asynchronous Sigma Delta Modulator; or ASDM
12.2 Integrate And Fire Modulator; or IAFM
12.3 Integral Pulse Frequency Modulator; or IPFM
13 delay circuit
14 UWB pulse generator; or UWB PG
15 amplifier
16 transmission line or antenna
17 power supply
20 receiving unit
21 receiving line or antenna
22 low noise amplifier; or LNA
23 unipolar pulse detector; or UPD
23.1 positive pulse detector; or PPD
23.2 negative pulse detector; or NPD
24 monostable multivibrator; or MM following UPD
25 signal processing means
25.1 signal processing means for ASDM modulation
25.2 signal processing means for IAFM modulation
25.3 signal processing means for IPFM modulation
26 power supply

The invention claimed is:
1. An energy-efficient system for distant measurement of analog signals, the system comprising:
  two or more measuring units; and
  a corresponding receiving unit;
    each measuring unit comprises:
      an analog input,
      a modulator that converts the analog input signal into a series of pulses, the modulator selected from the Time Encoding Machine family consisting of: an Asynchronous Sigma Delta Modulator, an Integrate And Fire Modulator and an Integral Pulse Frequency Modulator,
      a delay circuit coupled to an output of the modulator,
      an ultra-wide bandwidth pulse generator connected to transmission line or antenna directly or via an auxiliary amplifier, and
      a power supply; and
    the corresponding receiving unit comprises:
      a receiving line or antenna,
      a low noise amplifier coupled to the receiving line or the antenna,
      at least one unipolar pulse detector selected from a positive pulse detector or negative pulse detector coupled to an output of the low noise amplifier and where one monostable multivibrator follows each pulse detector,
      a signal processing means coupled to an output of the monostable multivibrator, and
      a power supply;
    all measuring units having identical modulators;
    all measuring units use delay circuits tuned to mutually different delay times $\tau_i$ that are used to identify the signal originating from the i-th measuring unit by the signal processing means;
    each ultra-wide bandwidth pulse generator of the i-th measuring unit is triggered by the series of pulses generated by the modulator and by the series of the same pulses delayed in time by the delay time $\tau_i$ by the corresponding delay circuit; where the signal from the delay circuit is optionally fed back to the modulator; and
    the signal processing means comprising demodulators compatible with the pre-selected type of modulators, and at least one set of identical delay circuits with delay times $\tau_i$ that corresponds to the set of delay times used by the measuring units;
    wherein the signal processing means extracts the received signal corresponding to the i-th measuring unit according to the delay time $\tau_i$ in the form of a pulse length suitable for being further processed to analog or digital information.

2. The energy-efficient system for distant measurement of analog signals according to claim 1, wherein,
  the selected modulator of all measuring units is the Asynchronous Sigma Delta Modulator;
  the receiving unit comprises the positive pulse detector and the negative pulse detector which are connected to the output of the low noise amplifier and followed by the corresponding monostable multivibrators and two sets of delay circuits tuned to different delay times $\tau_i$ corresponding to the delay times used by the measuring units within signal processing means; one set being connected to the branch dedicated to detection of positive pulses and another set being connected to the branch dedicated to detection of negative pulses; and
  the input into i-th Asynchronous Sigma Delta Demodulator comprises original signals from both branches, previously multiplied by their corresponding signals delayed by the delay time $\tau_i$.

3. The energy-efficient system for distant measurement of analog signals according to claim 2, wherein, each delay circuit of the different measuring unit has a different delay time $\tau_i$ adjusted in the manner that:

$\tau_i = T_p \cdot (jN + ji - j)$; where $i \in [1, N]$ is a positive integer; and  (a)

$\tau_i < T_c/2$;  (b)

where $T_c$ being minimum period of the pulsed signal out of the Asynchronous Sigma Delta Modulator, j being a positive integer, N being a number of users, and $T_p$ being ultra-wide bandwidth pulse width.

4. The energy-efficient system for distant measurement of analog signals according to claim 1, wherein, the selected modulator of all measuring units is the Integrate And Fire Modulator; and where the receiving unit comprises the unipolar pulse detector connected to the output of the low noise amplifier and followed by the monostable multivibrator and one set of delay circuits tuned to different delay times $\tau_i$ within signal processing means; where input into i-th Integrate And Fire Demodulator consists of the original signal previously multiplied by their corresponding signal delayed by the delay time $\tau_i$.

5. The energy-efficient system for distant measurement of analog signals according to claim 4, wherein, each delay circuit of the different measuring unit has a different delay time $\tau_i$ adjusted in the manner that:

$\tau_i = T_p \cdot (jN+ji-j)$; where $i \in [1,N]$ is a positive integer; and (a)

$\tau_i < T_{1\ min}$; (b)

where $T_{1\ min}$ being minimum period of the pulsed signal out of the Integrate And Fire Modulator, j being a positive integer, N being a number of users, and $T_p$ as being ultra-wide bandwidth pulse width.

6. The energy-efficient system for distant measurement of analog signals according to claim 1, wherein, the selected modulator of all measuring units is the Integral Pulse Frequency Modulator; and the receiving unit comprises the unipolar pulse detector connected to the output of the low noise amplifier and followed by the monostable multivibrator and one set of delay circuits tuned to different delay times $\tau_i$ within signal processing means; where input into i-th Integral Pulse Frequency Demodulator consist of original signal previously multiplied by their corresponding signal delayed by the delay time $\tau_i$.

7. The energy-efficient system for distant measurement of analog signals according to claim 6, wherein, each delay circuit of the different measuring units has the different delay time $\tau_i$ adjusted in the manner that:

$\tau_i = T_p \cdot (jN+ji-j)$; where $i \in [1,N]$ is a positive integer; and (a)

$\tau_i < T_{1\ min}$; (b)

where $T_{1\ min}$ being minimum period of the pulsed signal out of the Integral Pulse Frequency Modulator, j being a positive integer, N being a number of users, and $T_p$ being ultra-wide bandwidth pulse width.

8. The energy-efficient system for distant measurement of analog signals according to claim 1, wherein each signal generated by the ultra-wide bandwidth pulse generator in the measuring unit is transmitted via the transmission line or antenna, and transmission of each measuring unit is performed in an unsynchronized manner with other measuring units within the same system for distant measurement.

9. The energy-efficient system for distant measurement of analog signals according to claim 1, wherein the power supply is a micro energy harvesting device integrated into the measuring unit.

10. The energy-efficient system for distant measurement of analog signals according to claim 1, wherein the power supply is a battery integrated into the measuring unit.

11. Use of energy-efficient system for distant measurement of analog signals according to claim 1 for long term acquisition of analog signals.

12. Use of energy-efficient system for distant measurement of analog signals according to claim 11 where the analog signals are biological signals.

13. Use of energy-efficient system for distant measurement of analog signals according to claim 12 where the biological signals are time varying biological signals.

14. Use of energy-efficient system for distant measurement of analog signals according to claim 13 wherein the time varying biological signals are ECG signals or EEG signals.

* * * * *